(12) United States Patent  
Saito

(10) Patent No.: US 7,923,766 B2
(45) Date of Patent: Apr. 12, 2011

(54) SEMICONDUCTOR DEVICE INCLUDING CAPACITORLESS RAM

(75) Inventor: Masayoshi Saito, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 0 days.

(21) Appl. No.: 12/483,447

(22) Filed: Jun. 12, 2009

(65) Prior Publication Data

US 2009/0310431 A1 Dec. 17, 2009

(30) Foreign Application Priority Data

Jun. 12, 2008 (JP) ................................ 2008-154374

(51) Int. Cl.
*H01L 21/311* (2006.01)
*G11C 16/04* (2006.01)

(52) U.S. Cl. ............ 257/314; 257/E29.166; 365/185.1; 365/185.01

(58) Field of Classification Search ................ 257/288, 257/329, E29.166, 314, E21.495, E21.476; 365/207, 148, 203, 185.1, 185.01, 185.2
See application file for complete search history.

(56) References Cited

U.S. PATENT DOCUMENTS

| | | | | | |
|---|---|---|---|---|---|
| 5,698,869 | A | * | 12/1997 | Yoshimi et al. | 257/192 |
| 5,877,978 | A | * | 3/1999 | Morishita et al. | 365/149 |
| 6,061,267 | A | * | 5/2000 | Houston | 365/154 |
| 6,873,539 | B1 | | 3/2005 | Fazan et al. | |
| 6,969,662 | B2 | | 11/2005 | Fazan et al. | |
| 2002/0011603 | A1 | * | 1/2002 | Yagishita et al. | 257/190 |
| 2003/0006461 | A1 | * | 1/2003 | Tezuka et al. | 257/347 |
| 2004/0155317 | A1 | * | 8/2004 | Bhattacharyya | 257/616 |
| 2004/0227166 | A1 | * | 11/2004 | Portmann et al. | 257/222 |

FOREIGN PATENT DOCUMENTS

| | | |
|---|---|---|
| EP | 1 180 799 | 2/2002 |
| JP | 10-092952 | 4/1998 |
| JP | 2000-340679 | 12/2000 |
| JP | 2004-535669 | 11/2004 |

OTHER PUBLICATIONS

Oyo Buturi, vol. 75, No. 9, pp. 1131-1135 (2006).

* cited by examiner

*Primary Examiner* — Thomas L Dickey
*Assistant Examiner* — Nikolay Yushin
(74) *Attorney, Agent, or Firm* — Young & Thompson

(57) ABSTRACT

There is provided a semiconductor device including a capacitorless RAM. The semiconductor device includes a field effect transistor (FET) having a floating body structure. FET includes a channel body region arranged in a first region comprising a first semiconductor (e.g., p-SiGe) having a given band gap and a second region comprising a second semiconductor (e.g., n-Si) having a larger band gap than the first semiconductor.

20 Claims, 22 Drawing Sheets

SEMICONDUCTOR DEVICE INCLUDING CAPACITORLESS RAM

BACKGROUND OF THE INVENTION

1. Field of the Invention

The present invention relates to a semiconductor device, and more particularly to a floating body cell (hereinafter referred to as "FBC") type capacitorless RAM (Random Access Memory) which is electrically isolated from a substrate by use of an insulating material.

2. Description of the Related Art

In conventional DRAMs, electric charges are accumulated in capacitors to store information. In order to achieve a high degree of integration, the footprint of individual capacitors has been increasingly miniaturized, so a configuration of a high aspect ratio is used to provide a required capacitance, making the fabrication thereof more difficult. In order to address this problem, a cell (FBC) has been proposed which stores information using the floating body effect of transistor without using a capacitor. For example, FBC type RAM has been described in U.S. Pat. No. 6,969,662, National Publication of International Patent Application No. 2004-535669, Japanese Patent Laid-Open No. 2000-340679, EP1180799 and the like.

In FBC type RAM, many carriers are accumulated in floating body of a field effect transistor (FET) formed on SOI (Silicon On Insulator) substrate to store data. For example, in an operation of writing and reading data in n-type FET cell, it is defined for the convenience of explanation that a state where a larger number of holes are accumulated in floating body of p-type semiconductor is "1", and a state where a smaller number of holes are accumulated in floating body of p-type semiconductor is "0"; in this case, when the cell transistor is biased to a saturated state and holes generated by impact ionization are accumulated in p-type body, "1" is written. Meanwhile, when the p-n junction between p-type body and n-type source-drain is forward biased to clear out holes accumulated in p-type body, "0" is written. Further, in a reading operation, based on the floating body effect that the threshold voltage of transistor varies according to the number of holes accumulated in p-type body, stored data is differentiated by utilizing the fact that the current of cell of "1" is larger than that of "0".

However, according to the related art, the floating body effect cannot be satisfactorily kept for a desired period of time. More specifically, when DRAM using capacitor is replaced with FBC type RAM, there causes a problem that the time period of accumulating and holding carriers in body is too short, i.e., the refresh cycle time is too short. For example, referring to Oyo Buturi, vol. 75, No. 9, pp. 1131-1135 (2006), FIG. 6(B), worst-bit failure occurs at an interval of 10 msec, but it is needed to lengthen the interval to several hundred msec or more from a viewpoint of suppressing the power consumption.

Thus, it is desirable to provide a capacitorless RAM in which the retention time is increased so that the refresh cycle time is lengthened and the power consumption is significantly reduced.

SUMMARY

According to an embodiment of the present invention, there is provided a semiconductor device including a capacitorless random access memory (hereinafter, simply referred to as a capacitorless RAM), the device including a field effect transistor having a floating body structure, wherein: the field effect transistor includes a first region comprising a first semiconductor having a given band gap and a second region comprising a second semiconductor having a larger band gap than the first semiconductor; and a channel body region of the field effect transistor is disposed in the first region comprising the first semiconductor.

According to another embodiment of the present invention, there is provided a semiconductor device in which: the field effect transistor comprises the channel body region; a source region; a drain region; and a contact region electrically connected to said source or said drain region; and the second region comprising said second semiconductor is disposed between the channel body region and the contact region.

In the FBC type capacitorless RAM (hereinafter, referred to as an FBC type RAM) according to the present embodiment, the channel body region acting as floating body includes the first semiconductor having a given band gap, and the second semiconductor having a larger band gap than at least the first semiconductor is arranged between the contact plug connected to the source and drain section of the FET and the first semiconductor. Thus, the energy barrier in the source and drain side as seen from holes existing in the channel body section is raised. Accordingly, the amount of accumulating electric charges (holes) increases, so that the difference between the threshold voltage on accumulating the holes and the threshold voltage on drawing the holes is increased. As a result, the retention time is lengthened. Consequently, the refresh cycle time is lengthened, thus significantly reducing the power consumption.

Further, nondestructive reading of stored data is implemented, and the refresh operating time is shortened compared to conventional capacitor-storage type DRAM, so that the operation is sped up.

Further, for the FBC type RAM according to the present embodiment, the number of cell transistors can be reduced compared to SRAM, so that a high degree of integration is implemented. Also, a process compatible with that for logic devices can be used for fabrication, so that the FBC type RAM can be easily incorporated into an embedded device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

In an FBC type RAM according to the present invention, electric charges are accumulated in a semiconductor region called a body to store information. The threshold voltage of transistor varies according to the amount of accumulated electric charges; thus, using this characteristic, a current value is detected to determine whether the transistor is in an ON state or in an OFF state. Then, these states are associated with "1" or "0" and read out as information.

According to the present invention, in the write operation of accumulating electric charges in the semiconductor region, the efficiency of accumulating electric charges can be raised, and thus the difference of characteristic between an ON state and OFF state becomes more distinct to widen the margin for read operation, so that the information holding time is lengthened.

First Embodiment

Figure 1:
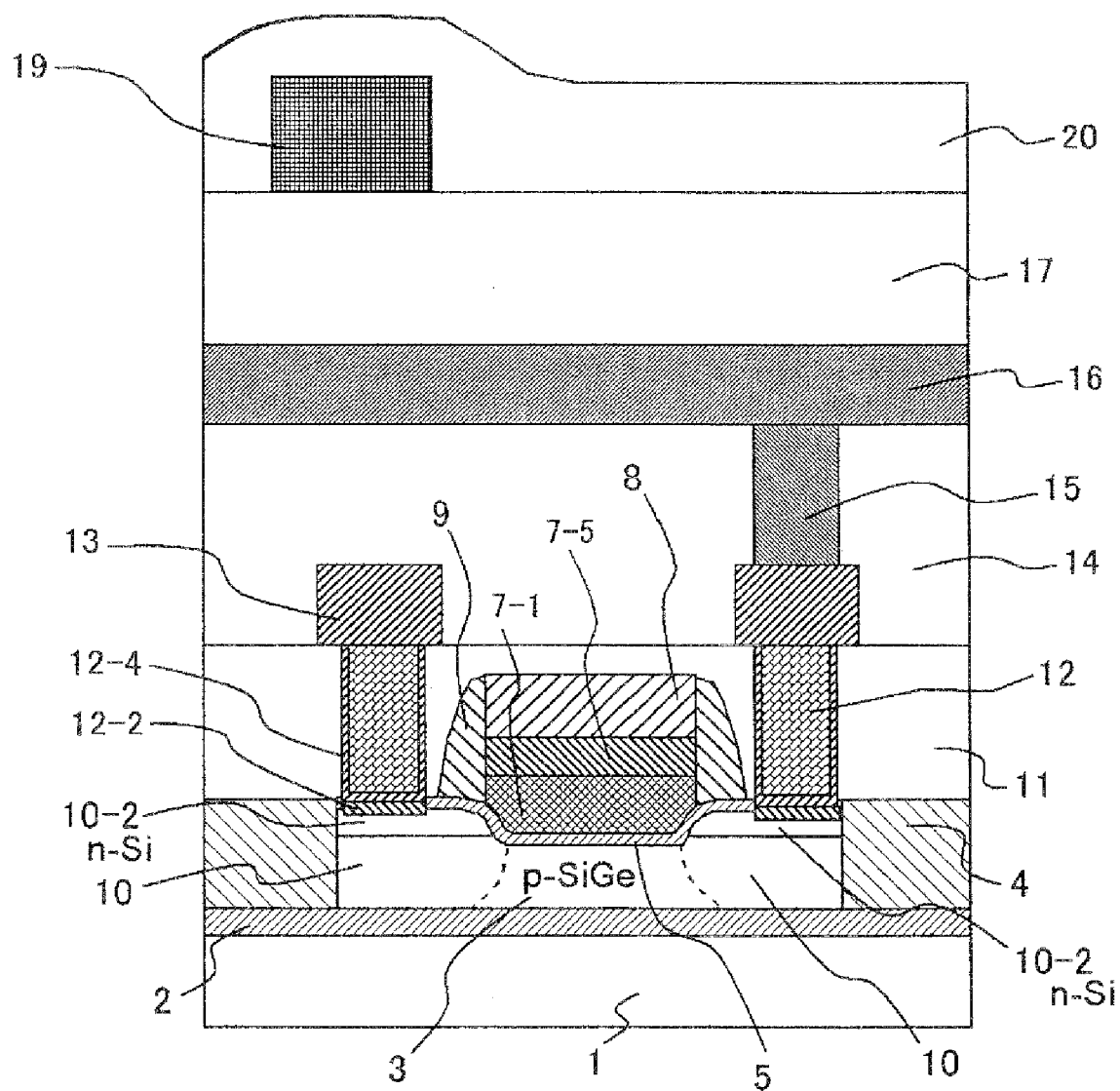
FIG. 1 is a cross-sectional view illustrating a structure of an FBC type RAM according to a first embodiment.

FIG. 1 illustrates a structure of the main part of an n-type MOS floating body cell (FBC) surrounded by an insulating film according to a first embodiment of the present invention. The main part includes, on semiconductor substrate 1, buried insulating film 2, body region 3, element isolation insulating film 4, gate insulating film 5, gate electrode 7 (gate polycrystalline silicon 7-1, gate metal layer 7-5), cap insulating film 8, sidewall spacer 9, source and drain region 10, insulating film (1) 11, contact plug 12, line (M1) 13, insulating film (2) 14, via plug (1) 15, bit line 16, insulating film (2) 17, line (M3) 19 and protective insulating film 20. Here, body region 3 includes p-type SiGe being a first semiconductor and has a smaller band gap than n-type Si being a second semiconductor constituting source and drain region 10.

Body region 3 is isolated from semiconductor substrate 1 by use of buried insulating film 2, and also electrically isolated from neighboring elements by use of element isolation insulating film 4.

According to the structure, the band gap of the second semiconductor constituting source and drain region 10 is set larger than that of the first semiconductor constituting body region 3. This structure can be implemented using the following configuration, for example.

The ordinary Si (Eg=1.12 eV) is used for source and drain region 10, and SiGe doped with Ge is used for body region 3. When Si is doped 15 atomic % with Ge, Eg changes to about 1.00 eV, which is smaller than Eg of Si.

According to the above characteristic, when electric charges (holes) are accumulated in body region 3, the energy barrier of source and drain region 10 as seen from holes existing in body region 3 is large, so that the number of accumulated holes (positive electric charges) is increased.

Figure 2A:
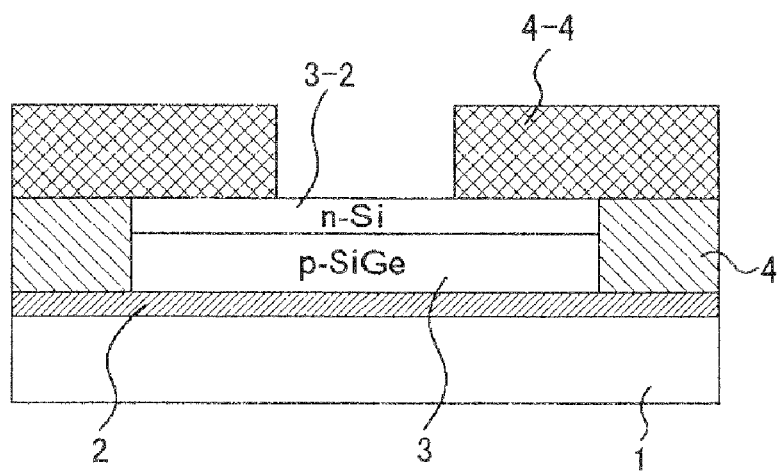
FIGS. 2A to 2E are procedural cross-sectional views for describing a procedure of fabricating the FBC type RAM illustrated in FIG. 1.

FIGS. 2A to 2E are substantial cross-sectional views for describing a fabrication process for forming the structure of FIG. 1. Here, an SOI substrate of buried insulating film structure is used. The SOI substrate is easily available in the market. P-type SiGe is used for the semiconductor layer (body region 3) on buried insulating film 2, and n-type Si layer 3-2 is further formed on the surface of body region 3 and thereafter element isolation insulating film 4 is formed, whereby resist pattern 4-4 is formed. FIG. 2A illustrates a cross-section at this stage.

The p-type SiGe layer can be formed from, for example, dichlorosilane ($SiH_2Cl_2$), germanium hydrate ($GeH_4$) and p-type impurity gas (for example, diborane ($B_2H_6$)) by chemical vapor deposition (CVD) or the like. Alternatively, a p-type Si layer is formed without using germanium and thereafter germanium ion is implanted, whereby the p-type SiGe layer can be formed. In this case, desired Eg is provided by regulating the doping amount of Ge. The n-type Si layer can also be formed from dichlorosilane ($SiH_2Cl_2$) and n-type impurity gas (for example, phosphine ($PH_3$)) by chemical vapor deposition (CVD) or the like.

Figure 2B:
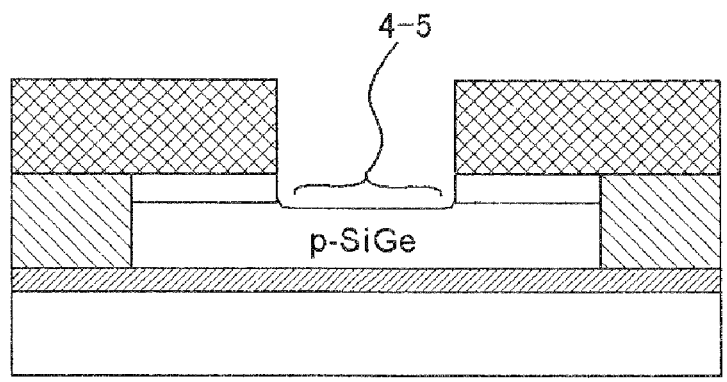
Figure 2C:
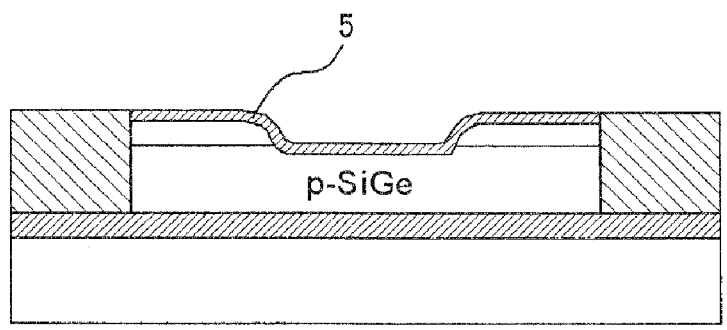
Figure 2D:
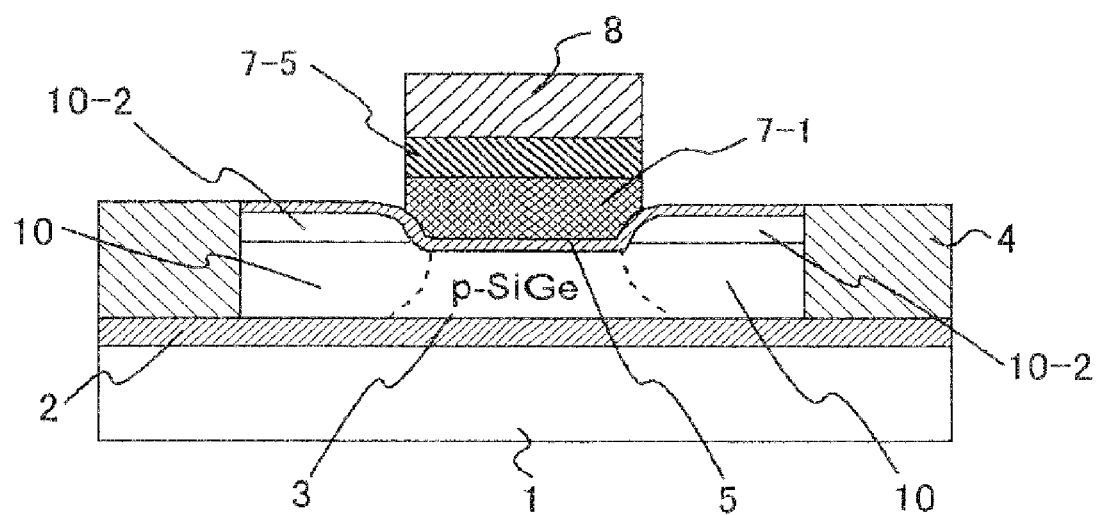
Figure 2E:
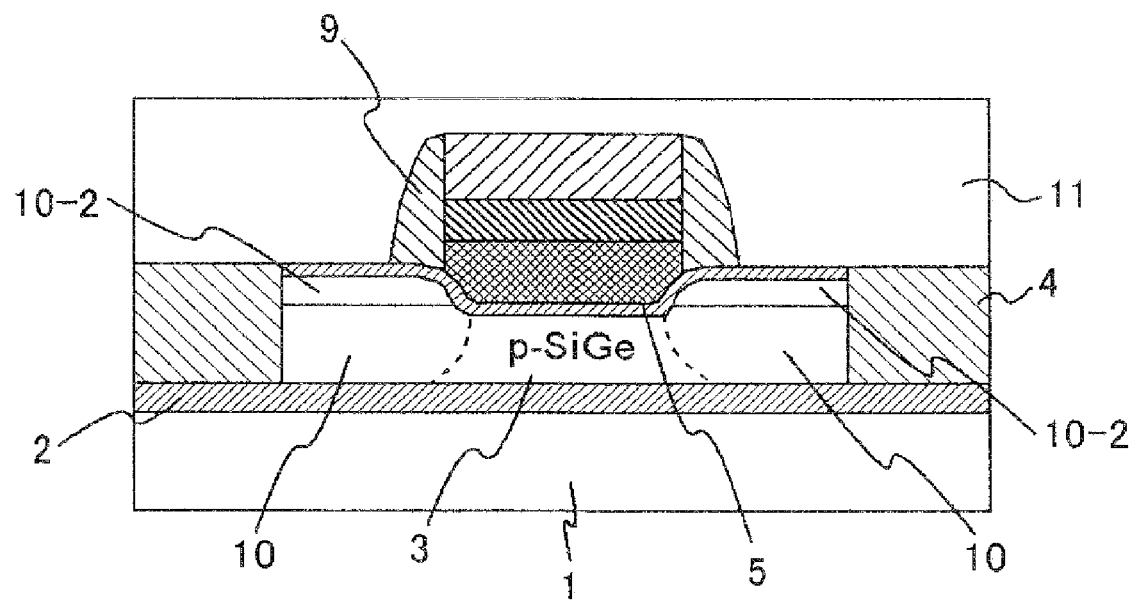

Subsequently, n-type Si layer 3-2 is etched by using resist pattern 4-4 as a mask, so that a part of body region 3 (the p-type SiGe layer being the first semiconductor) is exposed (FIG. 2B). Then, after removal of the resist pattern, a processing of smoothening the edge of n-type Si layer 3-2 is applied as required, the surface of the substrate is cleaned and thereafter gate insulating film 5 is formed (FIG. 2C). Silicon oxide film or silicon oxynitride film may be used for gate insulating film 5. The use of silicon oxide film is appropriate to suppress dopant exudation and thereby create a desired threshold voltage of FET. Further, gate polycrystalline silicon 7-1, gate metal layer 7-5 and cap insulating film 8 are sequentially formed and gate electrode 7 is formed by processing the materials. When metal silicide such as tungsten silicide of low resistance, titanium silicide or cobalt silicide is used for gate metal layer 7-5, a gate electrode of low resistance having a polycide structure can be formed. A multilayer structure containing a conductive barrier layer and a metal layer such as tungsten or molybdenum may also be used for gate metal layer 7-5. Here, a film containing metal nitride of TiN, WN or the like may be used for the conductive barrier layer. This structure has lower resistance than a polycide structure, allowing speeding up of circuit. When n-type impurity ion is implanted in a self-aligned manner using this gate electrode 7 as a mask, n-type source and drain region 10 is formed (FIG. 2D). In this case, the remnant n-type Si layer 3-2 changes to n-type Si source and drain 10-2. Thereafter, sidewall spacer 9 is formed on the side surface of gate electrode 7 and then first interlayer insulation film 11 is formed and a planarizing process is performed (FIG. 2E).

Moreover, it may also be possible to form silicide layers such as $TiSi_2$ layers or $CoSi_2$ layers on both gate poly-silicon and source/drain region by using salicide fabrication process. Then the contact resistance becomes small. As a result, circuit operation becomes high-speed.

Subsequently, after forming of a contact hole, a conductive material is buried to form contact plug 12. Contact plug 12 can be formed by filling a conductive material such as polysilicon in the contact hole. Tungsten(W)/TiN/Ti or Cu/TaN, that have a low resistivity, are also useful as a conductive material. Then the wiring resistance can be reduced by using such a metal plug, and being suitable for high-speed operation. Then, unwanted conductive material on first interlayer insulation film 11 is removed by CMP or the like, and line (M1) 13, via plug 15, bit line 16, insulating film 17, line (M3) 19 and protective insulating film 20 are formed, whereby a cell of floating body structure illustrated in FIG. 1 is formed.

Second Embodiment

A variation (second embodiment) is illustrated in FIGS. 3A to 3E.

An SOI substrate having buried insulating film 2 formed on substrate 1 is used. P-type SiGe is used for a semiconductor layer (body region 3) on buried insulating film 2. Element isolation insulating film 4, gate insulating film 5, polycrystalline silicon 7-1, metal layer 7-5 and cap insulating film 8 are sequentially formed and after processing the materials, gate electrode 7 is formed.

Here, a silicon oxide film or silicon oxynitride film containing nitrogen may be used for gate insulating film 5. Silicon oxynitride film has excellent resistance against exudation of dopant contained in polycrystalline silicon, so that it is preferable to use silicon oxynitride film.

Figure 3A:
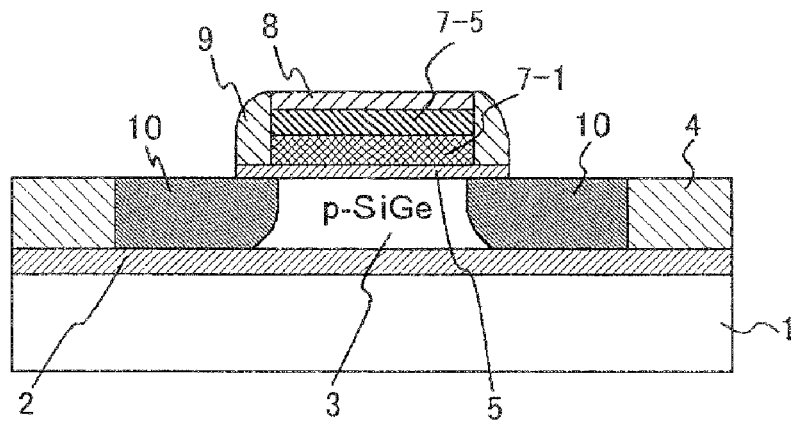
FIGS. 3A to 3E are cross-sectional views for describing a structure of an FBC type RAM according to a second embodiment.

Here, metal silicide such as silicides of refractory metal (e.g., tungsten silicide, titanium silicide or cobalt silicide) may also be used for metal layer 7-5. Alternatively, when metal layer 7-5 is constructed as a multilayer film of refractory metal such as tungsten and barrier metal containing metal nitride such as TiN or WN, a gate electrode of lower resistance is provided. The use of a gate electrode of lower resistance allows implementation of a circuit of high operating speed. When n-type impurity ion is implanted in a self-matching manner using this gate electrode 7 as a mask, n-type source and drain region 10 is formed. Subsequently, sidewall spacer 9 is formed, whereby the structure of FIG. 3A is formed.

Figure 3B:
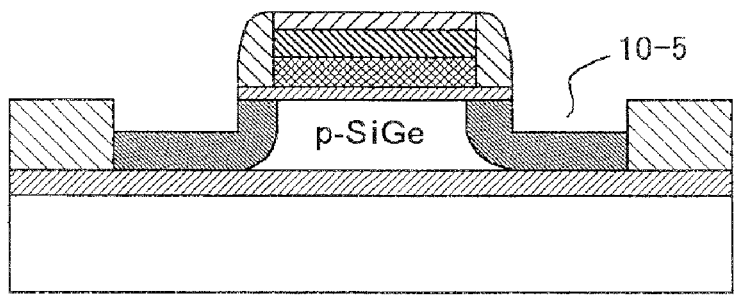
Figure 3C:
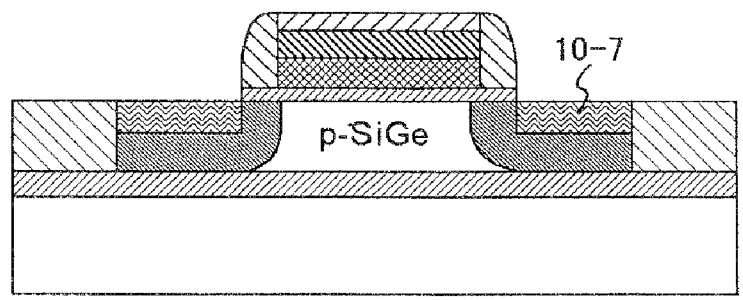
Figure 3D:
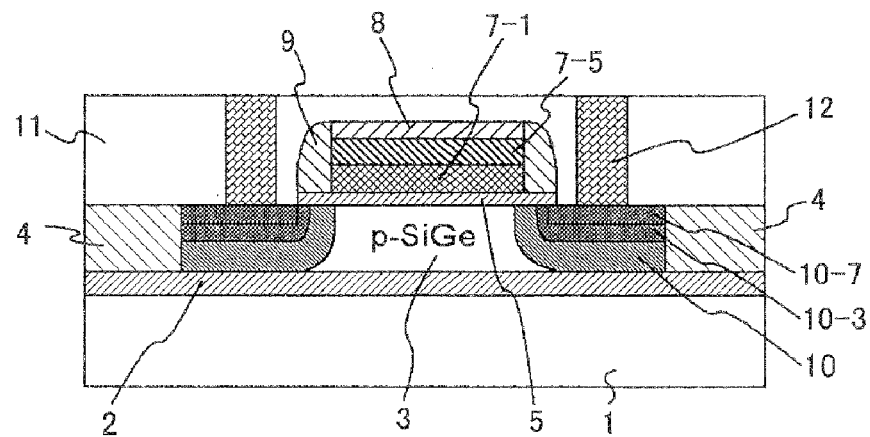
Figure 3E:
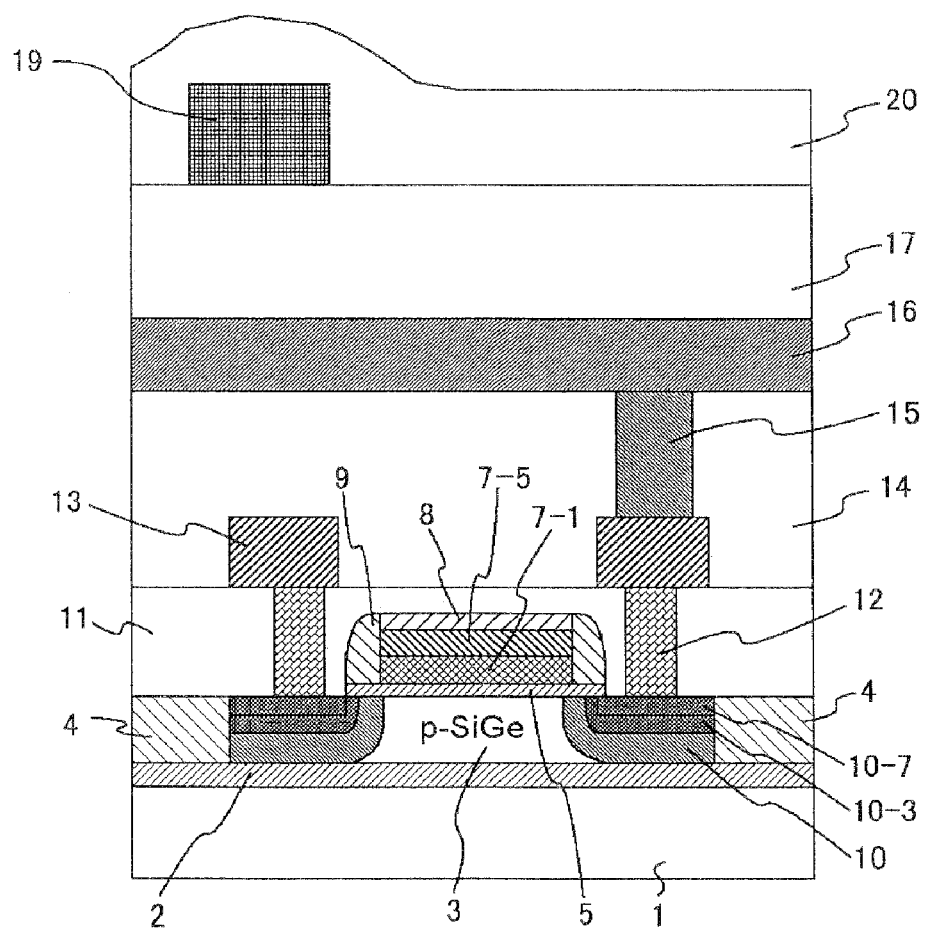

Subsequently, a part of source and drain region 10 is removed to form recess 10-5. In this case, self-aligned process may be applied to element isolation insulating film 4, the gate electrode and sidewall spacer 9; as a result, a structure of FIG. 3B is provided. Subsequently, Si layer 10-7 is formed by filling the above recess 10-5 using a selective epitaxy technique (FIG. 3C). Subsequently, ion implantation is performed in a self-aligned manner using the gate electrode and sidewall spacer as a mask to form high-density source and drain 10-3. Then, first interlayer insulation film 11 and contact plug 12 are formed, whereby a structure of FIG. 3D is provided. Either tungsten(W)/TiN/Ti or Cu/TaN can be used for a via plug. The wiring resistance can be reduced by using such a metal via plug, and also being suitable for high-speed operation. According to this structure, also, Si layer 10-7 formed in a part of source and drain 10 has a high energy barrier against holes in body region 3; thus the efficiency of accumulating holes rises. Subsequently, insulating film 14, line (M1) 131 via plug 15, bit line 16, insulating film 17, line (M3) 19 and protective insulating film 20 are formed, whereby a cell of floating body structure illustrated in FIG. 3E is provided.

A low density dopant area can be disposed at least between the channel body region and a high density dopant area of the source or drain region. This structure can be made by using a conventional technique such as an ion implantation technique. The information hold time becomes long because the electric field at the edge of the source or drain region can be suppressed so that the junction leakage current decreases. The structure is useful to reduce the operation power.

Third Embodiment

Figure 4A:
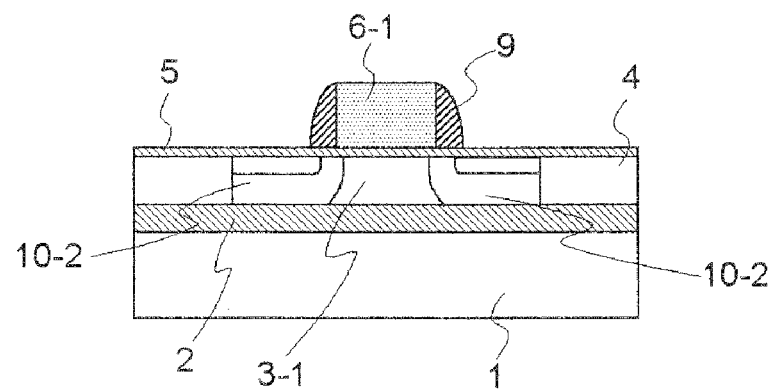
FIGS. 4A to 4D are procedural cross-sectional views for describing a procedure of fabricating an FBC type RAM according to a third embodiment.
Figure 4B:
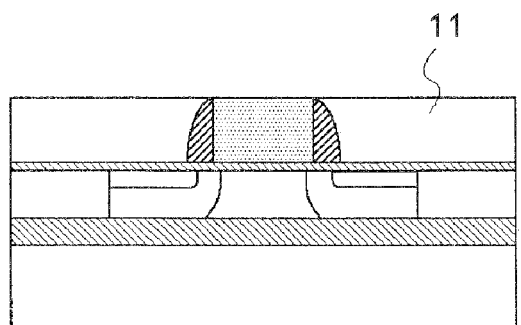

Another variation (third embodiment) will be described. FIG. 4A illustrates a cross-sectional structure of a transistor of a floating body structure having polycrystalline silicon 6-1 formed therein. This polycrystalline silicon 6-1 is a dummy gate, and semiconductor layer 3-1 is composed of p-type Si, but in other aspects, the same reference numerals are applied to parts corresponding to those of the above described embodiment. Subsequently, smoothed insulating film 11 is formed (FIG. 4B), and polycrystalline silicon 6-1 being a dummy gate is etched and removed.

Figure 4C:
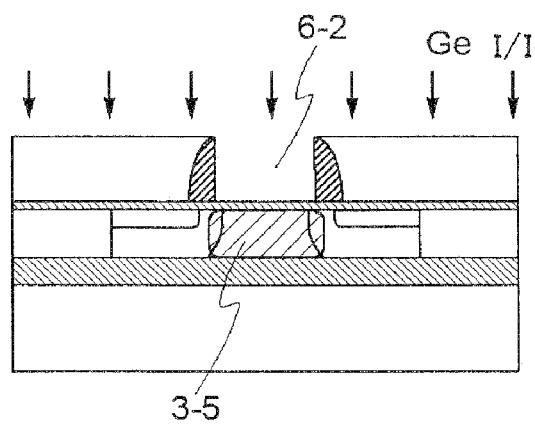
Figure 4D:
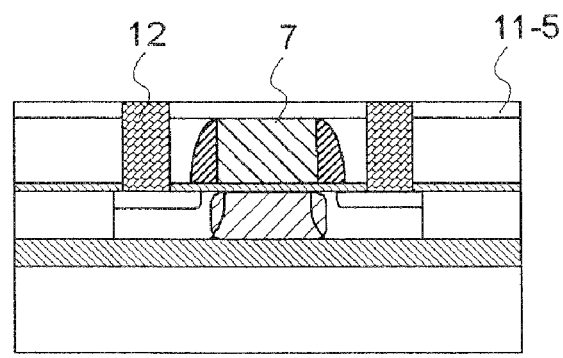

Subsequently, p-type Si semiconductor layer (3-1) is doped with Ge via part (6-2) obtained by removing the dummy gate, whereby Ge-doped p-type Si region (3-5) is formed (FIG. 4C). In this doping, ion implantation or plasma doping technique may be used. The damaged oxide film is removed, the surface of the substrate is cleaned and thereafter gate insulating film 5 is formed. Then, a gate electrode material is buried and a gate electrode is formed using CMP. After forming of the smoothed insulating film, a contact plug is formed, whereby a structure of FIG. 4D is provided.

Fourth Embodiment

Figure 5A:
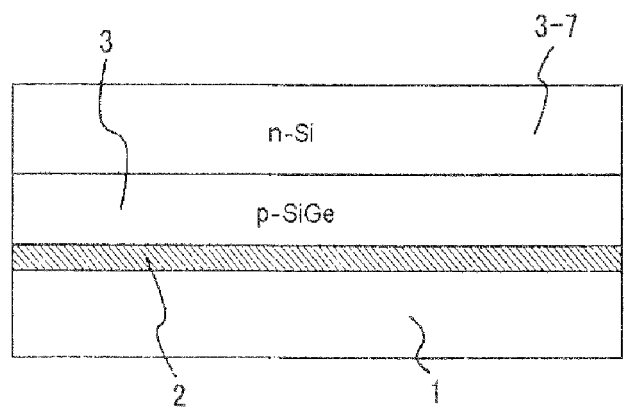
FIGS. 5A to 5E are cross-sectional views for describing a structure of an FBC type RAM according to a fourth embodiment.
Figure 5B:
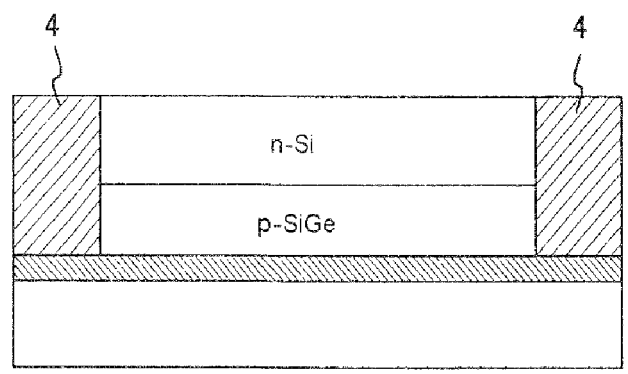
Figure 5C:
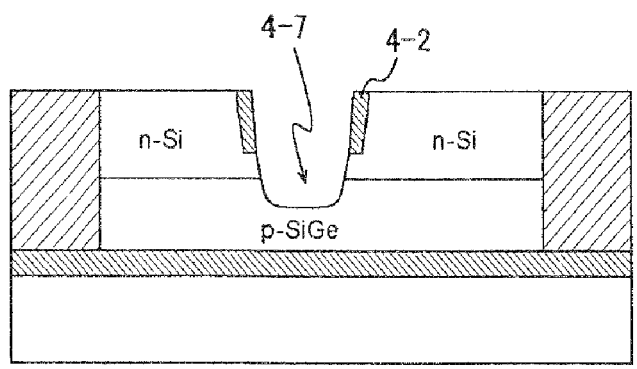
Figure 5D:
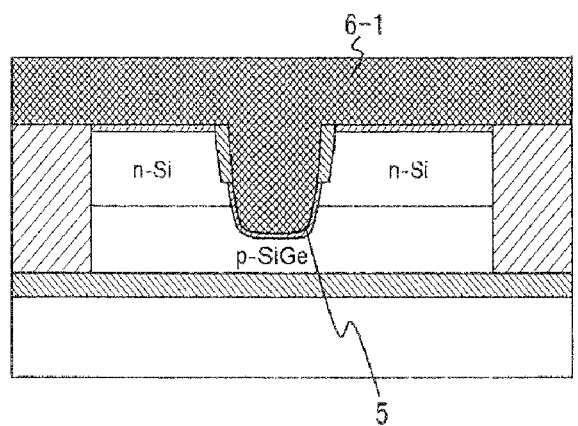
Figure 5E:
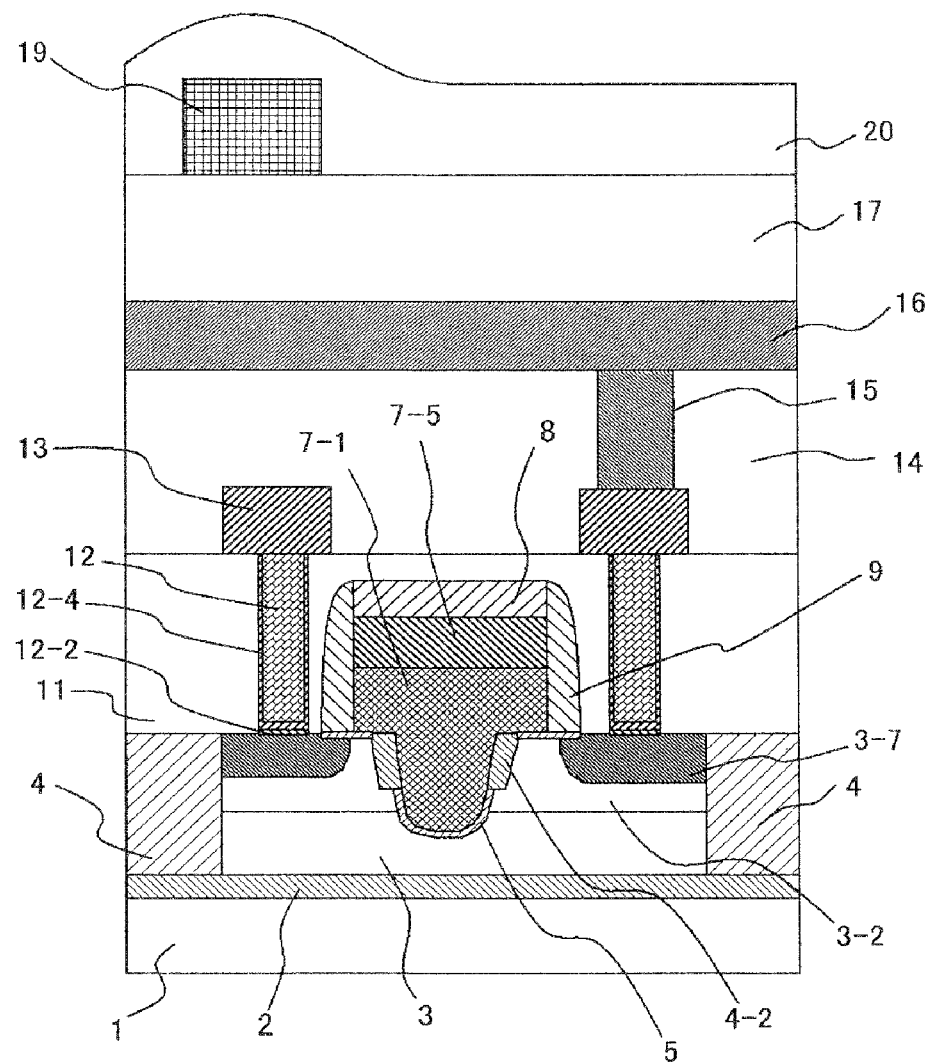

Another variation (fourth embodiment) will be described. FIGS. 5A to 5E illustrate a structure and fabrication procedure of recess gate type FBC. First, as illustrated in FIG. 5A, Si substrate 1 (SOI substrate) is prepared which is provided with buried insulating film 2, body region 3 of p-type SiGe and n-type Si layer 3-7. Subsequently, as illustrated in FIG. 5B, element isolation insulating film 4 is formed and after forming of buried gate recess 4-7 as illustrated in FIG. 5C, gate insulating film 6 (illustrated in FIG. 5D) is formed. When collar insulating film 4-2 is, as illustrated in FIG. 5C, formed, the capacitance between substrate 1 and the gate can be reduced. Thereafter, polycrystalline silicon 6-1 acting as a gate electrode (word line) is, as illustrated in FIG. 5D, buried and processed. Thereafter, the ordinary fabrication procedure is performed similarly to the above, whereby a structure illustrated in FIG. 5E is provided. Here, silicon oxide film is formed as the gate insulating film. Silicon oxynitride film may also be formed as the gate insulating film. Particularly, when the polycrystalline silicon is doped with boron, silicon oxynitride film is preferably used because the threshold value of FET is stabilized to reduce the variation.

In the above description of recess gate type FBC, a case has been described where FBC having the body structure according to the first embodiment is modified to form a recess type FBC; but the present invention is not limited thereto. The body structure according to the second or third embodiment may also be modified.

Fifth and Sixth Embodiments

Figure 6A:
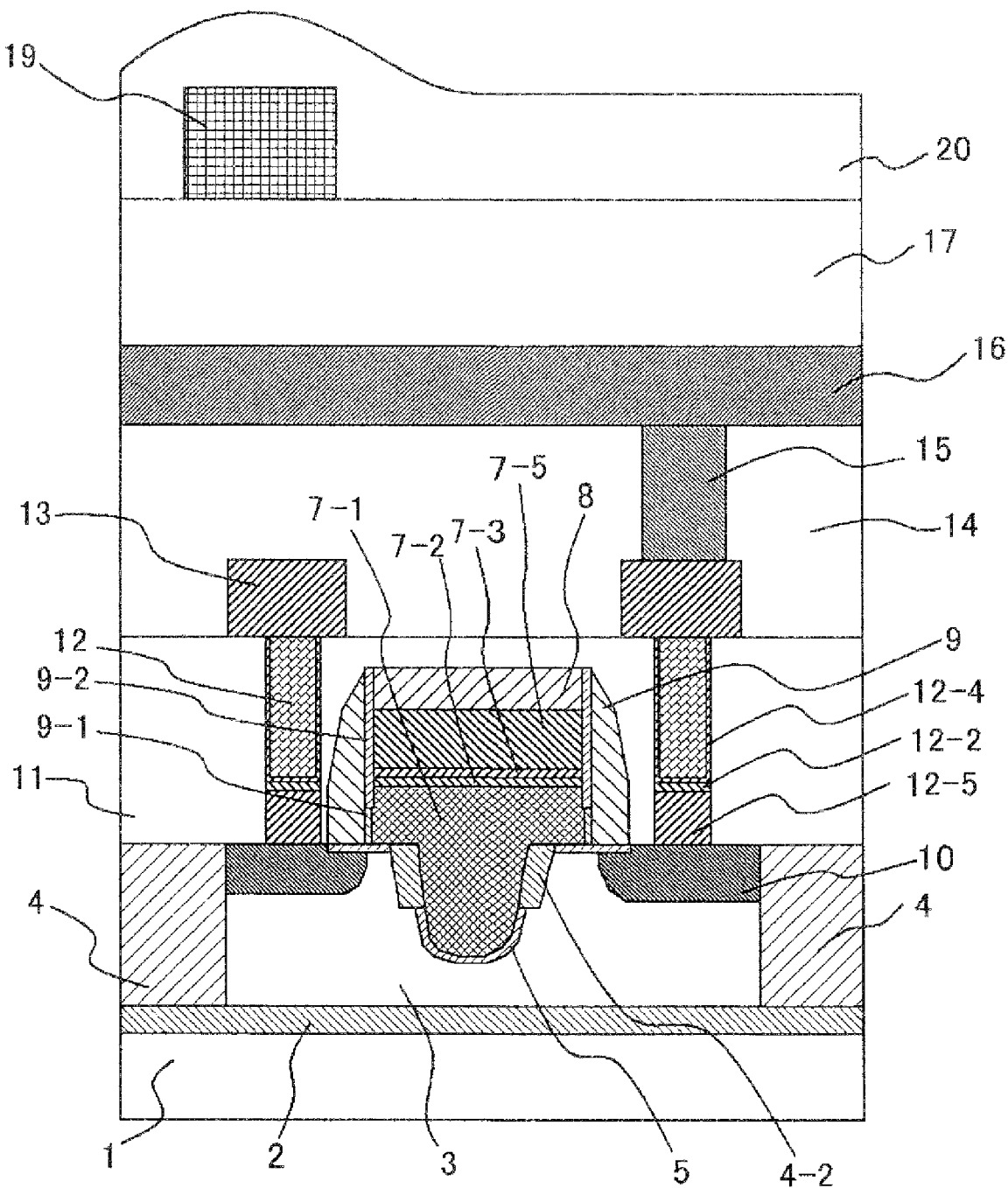
FIG. 6A is a cross-sectional view for describing a structure of an FBC type RAM according to a fifth embodiment.
Figure 6B:
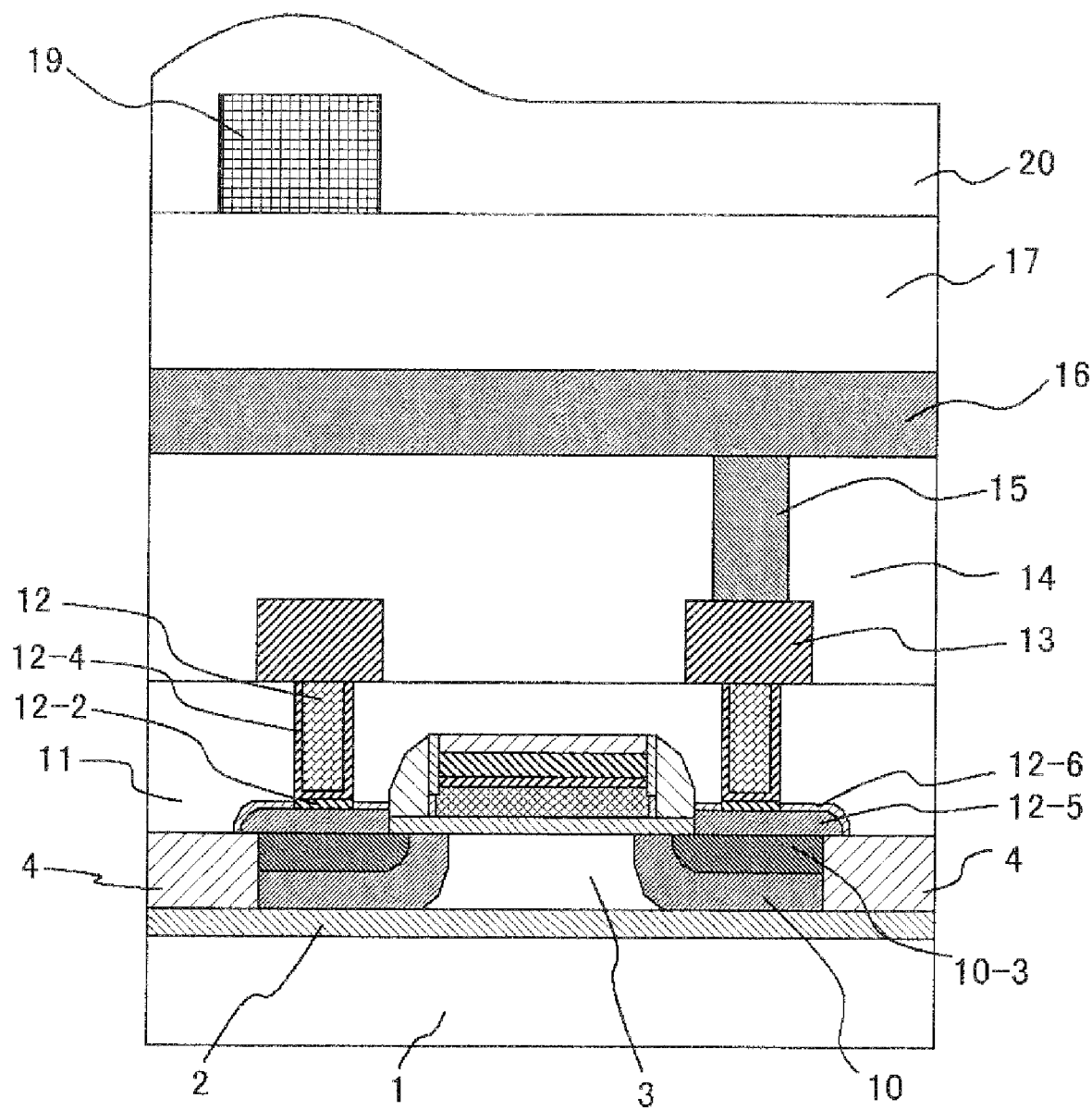
FIG. 6B is a cross-sectional view for describing a structure of an FBC type RAM according to a sixth embodiment.

Another variation (fifth and sixth embodiments) will be described. Referring to FIGS. 6A and 6B, build-up silicon region 12-5 is formed in the lower part of a contact region. Body region 3, and source and drain region 10 are formed of a first semiconductor (e.g., p-type SiGe) having a smaller band gap, and a second semiconductor having a larger band gap is built up in a region connected to the source and drain region.

Referring to FIG. 6A, build-up silicon region 12-5 is formed as the base structure of the contact region. Referring to FIG. 6B, build-up silicon region 12-5 is formed to cover the whole source and drain region. In order to construct the structure of FIG. 6A, for example, a contact hole reaching the source and drain region is formed in first interlayer insulation film 11 and thereafter build-up silicon region 12-5 is formed in the contact hole by epitaxial growth and contact plug 12 is further formed thereon. In order to construct the structure of FIG. 6B, before forming of first interlayer insulation film 11, build-up silicon region 12-5 is formed by epitaxial growth and then protective insulating film 12-6 is formed and thereafter the upper structure is formed by the ordinary technique. Here, the gate electrode may have any structure of recess gate illustrated in FIG. 6A and planar gate illustrated in FIG. 6B. Here, an example is illustrated in which sidewall protective film (1) 9-1 and sidewall protective film (2) 9-2 are formed between the gate electrode and sidewall spacer 9, but the present invention is not limited thereto. For gate electrode 7, an example is illustrated in which barrier layers (7-2, 7-3) are formed between gate polycrystalline silicon 7-1 and metal layer 7-5. Film containing nitride film of conductive metal may be used for the barrier layer. Examples include known TiN, WN, TiN/Ti, TiN/TiSi and WN/Si multilayer structures.

When multiple materials different in band gap are, as described later in variations, used in the drain side, a build-up semiconductor layer having a larger band gap may be further arranged on the body structure described in the first to third embodiments. Further, the buried semiconductor layer described in the second embodiment and the build-up semiconductor layer may be combined; for example, the source region may be formed as a buried semiconductor layer, a build-up semiconductor layer being formed on the drain region.

Further, the constituent materials are not limited to Si and SiGe as long as they are different in band gap, and another chemical compound semiconductor may be used. Any band structure may be used in which the energy barrier as seen from holes accumulated in the body region is high. The band gap difference ($\Delta Eg$) is preferably 0.05 eV or greater and more preferably 0.1 eV or greater.

Seventh Embodiment

Figure 7A:
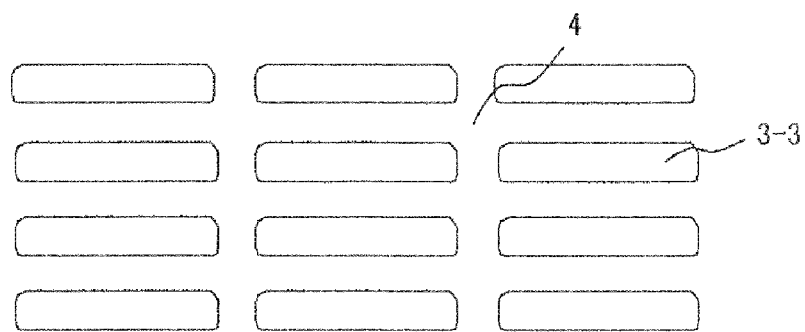
FIGS. 7A to 7E are plan views illustrating a procedure of fabricating a memory array according to one embodiment.
Figure 7B:
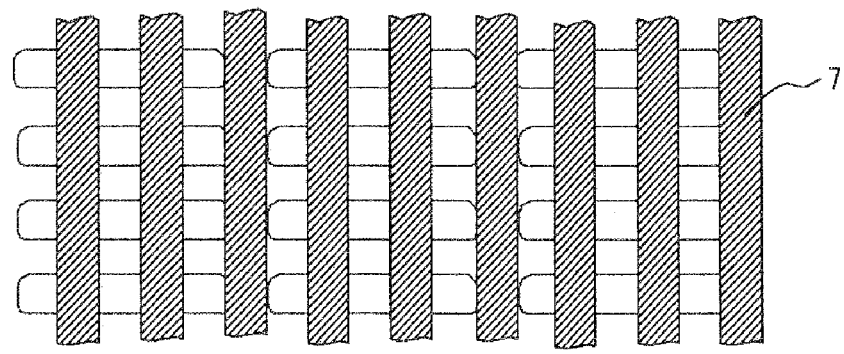
Figure 7C:
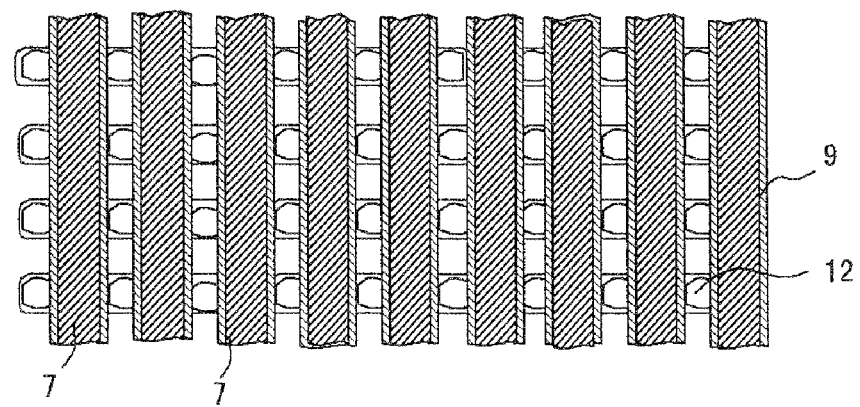
Figure 7D:
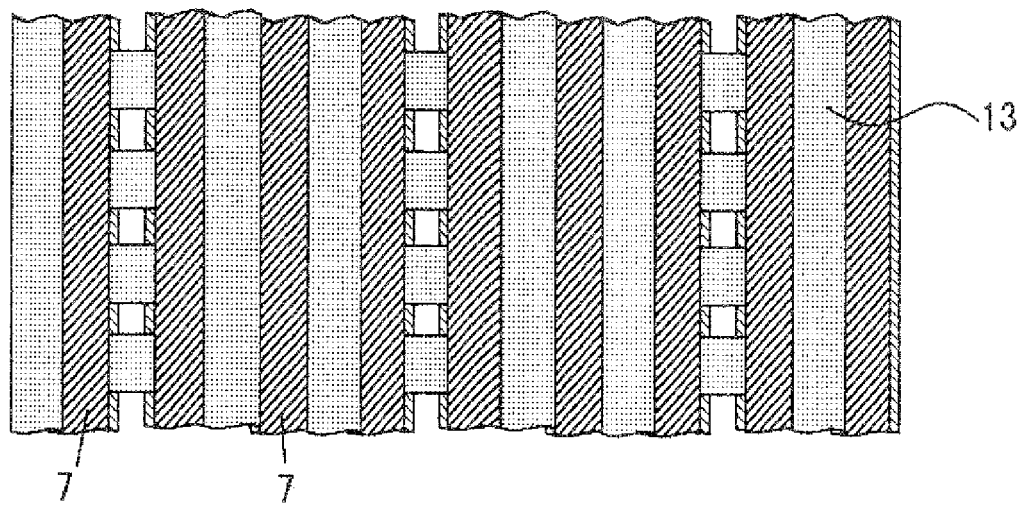
Figure 7E:
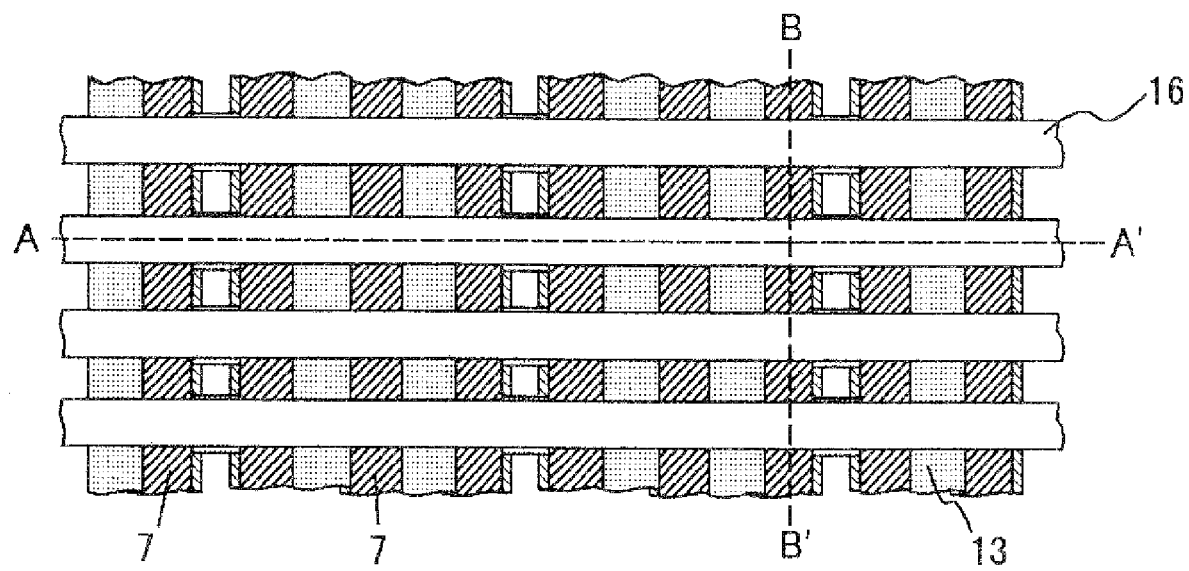

Another embodiment (seventh embodiment) will be described. FIGS. 7A to 7E are plan views illustrating a procedure of fabricating a memory array according to an embodiment of the present invention. FIG. 7A is a plan view illustrating a state where island-shaped semiconductor active regions 3-3 are isolated in element isolation insulating film 4 using an SOI substrate. Referring to FIG. 7A, each active region 3-3 has a size of two transistors formed and has the above described body structure. Subsequently, gate electrode 7 (word line) is formed as illustrated in FIG. 7B. Subsequently, doping of impurity for forming a source and drain region is performed to form sidewall spacer 9 of gate electrode. Subsequently, interlayer insulating film and contact plug are formed (FIG. 7C). In FIG. 7C, the active region under the interlayer insulating film is also illustrated for the convenience of showing the positional relationship. Subsequently, as illustrated in FIG. 7D, source potential line 13 is formed, and an interlayer insulating film is formed, and a bit line contact is formed and then bit line 16 is formed. The plan view thereof is illustrated in FIG. 7E. In FIG. 7E, also, a lower layer line and the like are illustrated for the convenience of showing the position of sections under the interlayer insulating film.

Figure 8A:
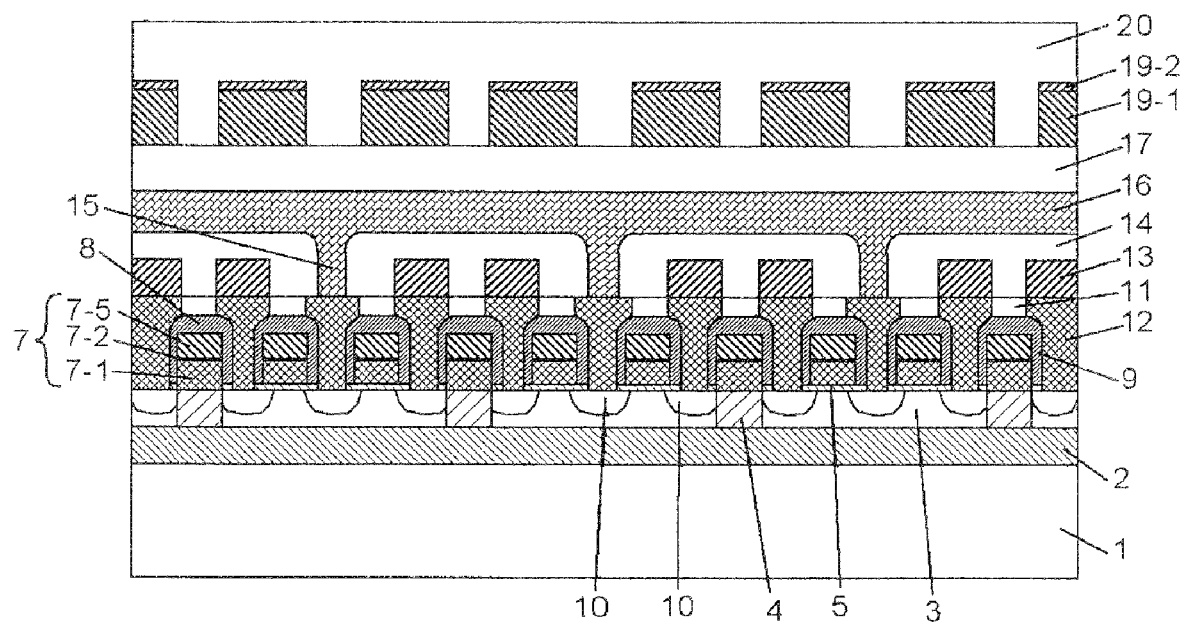
FIG. 8A is a cross-sectional view along the line A-A' of FIG. 7E.
Figure 8B:
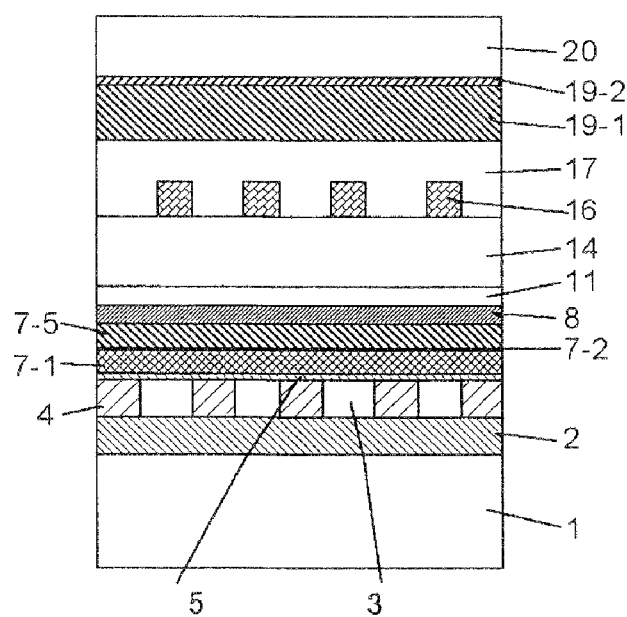
FIG. 8B is a cross-sectional view along the line B-B' of FIG. 7E.

FIG. 8A is a cross-sectional view along the line A-A' of FIG. 7E, and FIG. 8B is a cross-sectional view along the line B-B' of FIG. 7E. In FIGS. 8A and 8B, the same reference numerals are applied to the parts described above. Here, the first semiconductor and second semiconductor are not illustrated, but the first or second embodiment may be applied in which the first semiconductor is used for body 3 and the second semiconductor is used for source and drain region 10. In this embodiment, a case is described in which two transistors are formed in each active region; but one transistor may be formed in each active region. In this case, interference between neighboring transistors can be eliminated to enlarge the operating margin. Further, those skilled in the art will easily understand that another variation may also be applied.

Figure 9:
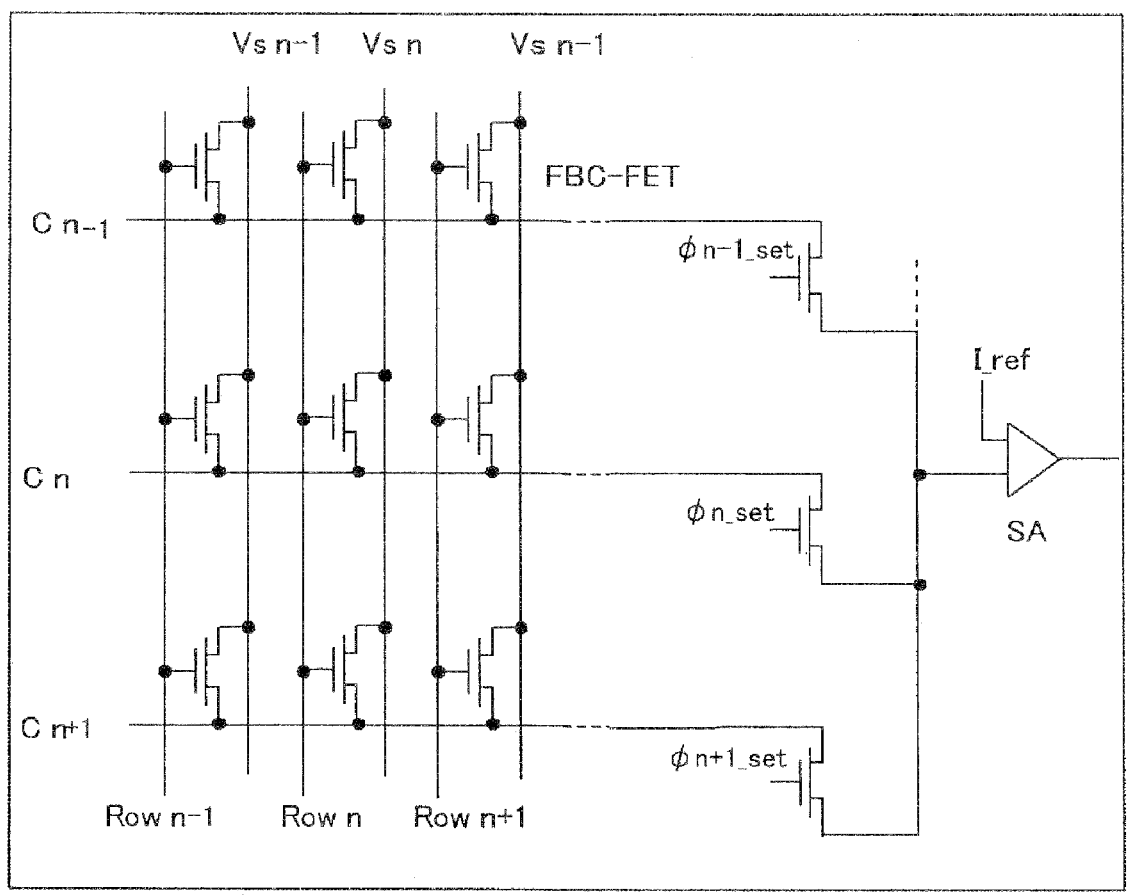
FIG. 9 is a view for describing a circuit arrangement for a memory array in which FBC-FET according to the one embodiment is used as a central transistor.

FIG. 9 is a view for describing a circuit arrangement for a memory array in which an FBC-FET according to the present invention is used as a central transistor. Each central transistor is arranged in an intersection of a word line represented by "Row n" and bit line represented by "Cn". One of the source and drain of the central transistor is connected to the bit line and the other one, to the source line represented by "Vs n". The bit line is connected via a switchable switch ($\phi n\_set$) to sense amplifier SA. Current having a value between ON current and OFF current of the central transistor can be supplied for reference current (I_ref) of sense amplifier SA at the time of detection.

<<Description of Circuit Operation>>

The circuit operation of the FBC type RAM according to the present invention will be described.

1) Standby State:

A write operation will be described with reference to FIGS. 10A to 10D. In these figures, the connecting portion of the source, body and drain in the semiconductor is illustrated. C.B. denotes a lower end of conduction band; F.L. denotes Fermi level; and V.B. denotes an upper end of valence band. Schematically, electron is represented by a hatched circle, and hole is represented by an outline circle.

Figure 10A:
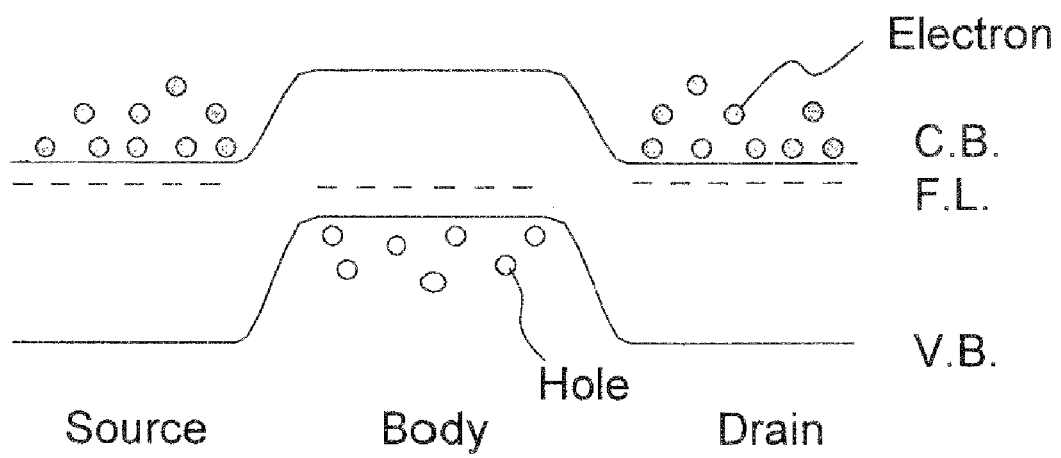
FIG. 10A is a band diagram for describing the principle of operation of an FBC type RAM according to the one embodiment, showing an equilibrium state where all the biases are set to 0 V.

FIG. 10A illustrates a band diagram of an equilibrium state after a given time has elapsed after turning off of the power source. This is a thermal equilibrium state, so the source and drain regions being n-type semiconductor have electrons being carriers distributed in conduction band; and the body region being p-type semiconductor has holes distributed in an upper part of valence band.

Figure 10B:
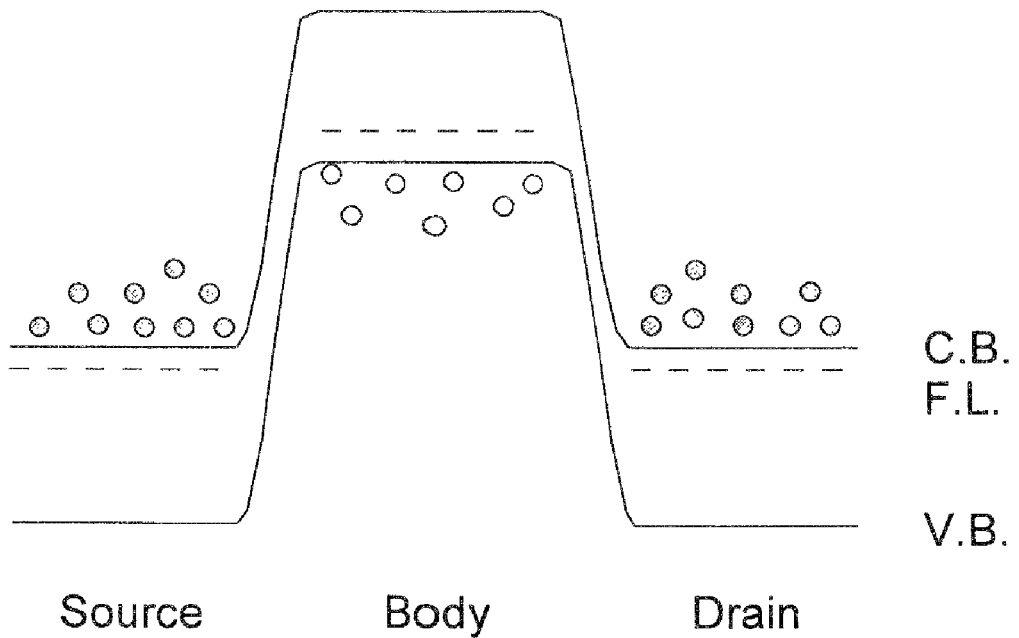
FIG. 10B is a band diagram showing a standby state where the body potential is kept negative so that positive electric charges are held.

In this state, when a first voltage (−2 V in FIG. 10B) is applied to the gate, the band of the body region changes as illustrated in FIG. 10B. The state illustrated in FIG. 10B corresponds to the standby state.

Figure 10C:
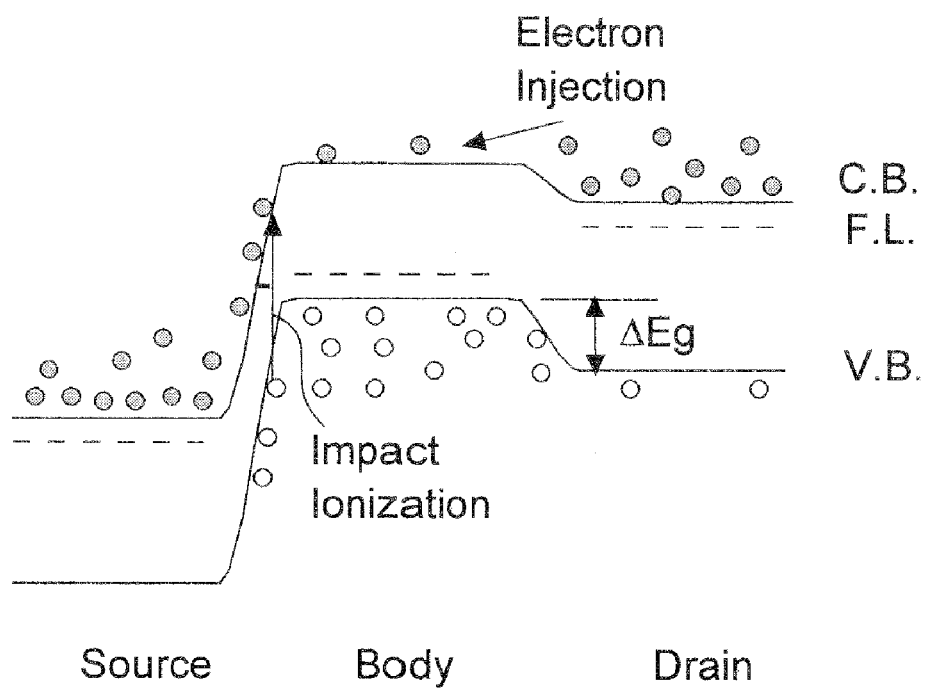
FIG. 10C is a band diagram showing a state where data "1" is written (holes are accumulated)

2) Operation of Writing "1" (Accumulating Holes in the Body Region):

Subsequently, a write operation of accumulating positive electric charges in the body region is, as illustrated in FIG. 10C, performed by creating "avalanche breakdown". While the source voltage is kept at 0 V, the drain voltage is set to −2 V and the gate voltage is set to −1.5 V. These voltages are not limited to these values as long as a reverse bias state is formed for creating "avalanche breakdown" in the connecting portion of the body region and source region under the gate. The drain voltage is set approximately −0.5 V relative to the gate voltage to inject electrons; electrons distributed in conduction band in the drain side are supplied via the body region to the connecting portion of the body region and source region. In this case, the band gap of semiconductor in the source and drain regions is set larger than the band gap of semiconductor in the body region. As a result, some electrons distributed in conduction band of the drain region goes through conduction band of the body region to the body-source connecting portion; in this connecting portion, electron-hole pair is formed by electron accelerated by electric field, and further "avalanche breakdown" is created by these carriers to produce many electrons and holes. The electrons thus produced flow to conduction band of the source region. Meanwhile, the holes are concentrated in the upper side of valence band of the body region. Here, holes incapable of going over band barrier ($\Delta Eg$) as seen from holes remain in the body region. When the band gap in the drain region is set larger, this band barrier ($\Delta Eg$) becomes higher, so that the number of accumulated holes increases. This accumulation of holes is equivalent to positive biasing of the body. In this case, in FBC of nMOS, the threshold voltage (Vt) is lowered by an effect equivalent to positive biasing of substrate, so that electrons are readily supplied from the source region and thus a larger amount of current flows in FBC of nMOS. That is, a larger number of holes are accumulated in the body region, whereby data "1" is stored.

Figure 10D:
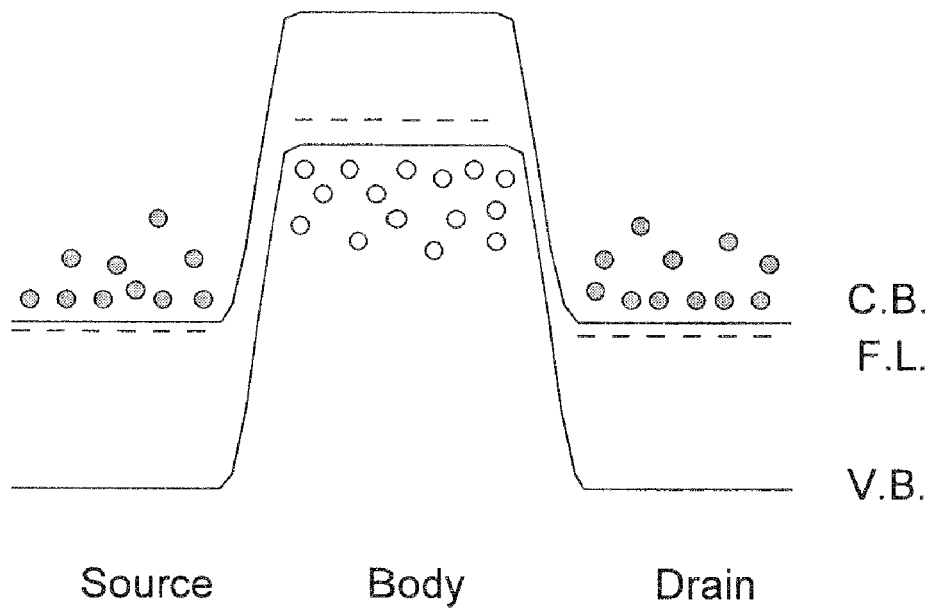
FIG. 10D is a band diagram showing a standby state after data "1" has been written (holes have been written)

FIG. 10D illustrates a band diagram of a standby state after accumulation of holes. As illustrated in FIG. 10D, the drain voltage is set to 0 V, and the gate voltage is set to −2 V. As a result, the potential difference with respect to holes is large, so holes can be held in the body region for a long period of time.

3) Operation of Writing "0" (Drawing Holes from the Body Region)

Figure 11A:
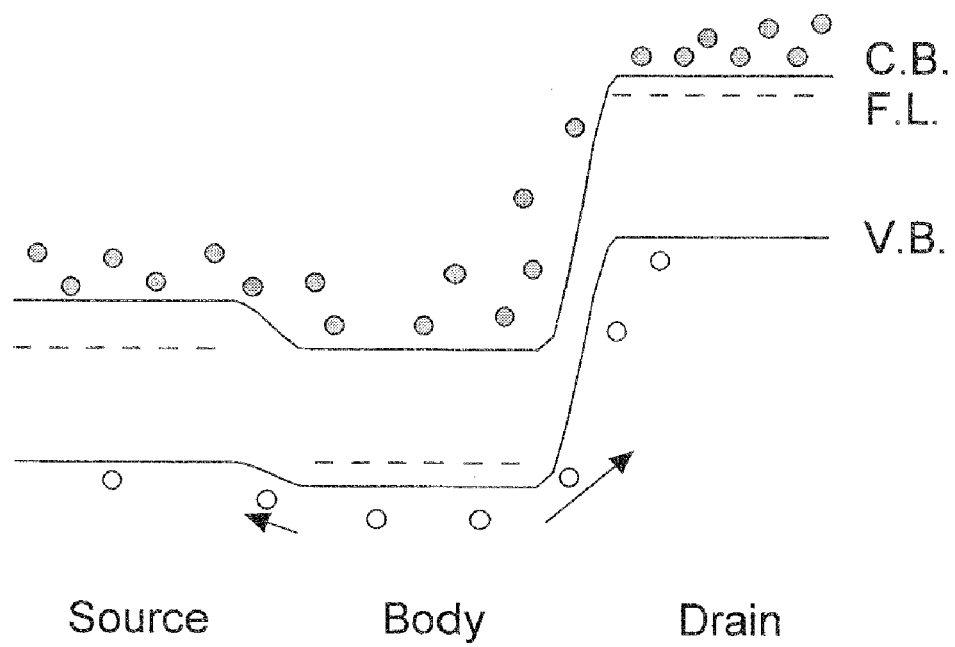
FIG. 11A is a band diagram showing a state where data "0" is written (holes are drawn)

In the standby state (the gate voltage being −2 V, the source and drain voltages being 0 V) illustrated in FIG. 10A, the gate voltage is, as illustrated in FIG. 11A, set to +1 V, and the drain voltage, to −2 V. In this case, holes in the body region shift to the source and drain regions in which the energy is lower with respect to holes. The difference of energy between the drain and body is set large, so holes are accelerated by electric field and drawn at the end of the drain.

Figure 11B:
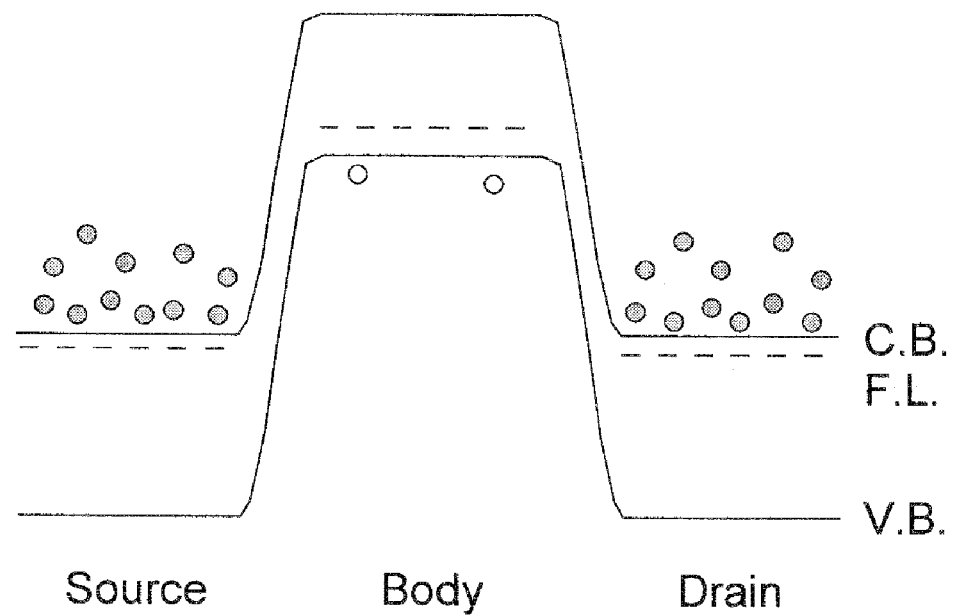
FIG. 11B is a band diagram showing a standby state after data "0" has been written.

Subsequently, the gate voltage is, as illustrated in FIG. 11B set to −2 V, and the drain voltage, to 0 V. As a result, electrons in conduction band of the body region shift to conduction band of the source or drain region; in valence band of the body region, holes are drawn and thus the number of holes remains small. Accordingly, a state equivalent to when the body is negatively biased is provided. In this case, when the gate voltage (gate voltage for reading) is set to an appropriate value, electrons are hardly supplied from the source to the channel body region, and the threshold voltage (Vt) is large, so a significantly small amount of current flows in FBC of nMOS (FBC of nMOS is turned off). That is, holes are drawn from the body region, whereby data "0" is stored.

4) Read Out Operation:

The read out operation will be described. In the standby state illustrated in FIGS. 10D and 11B, the gate voltage for reading is set to an intermediate value between the threshold voltage of transistor for writing data "1" and the threshold voltage of transistor for writing data "0". An appropriate potential difference of 0.5 V or less is set between the source and drain, and the gate voltage (gate voltage relative to the source) Vg is set to 0.8 to 1.0 V so that the state of "1" can be differentiated from the state of "0". For example, the gate voltage is set to +1 V and the drain voltage, to 0.3 V. As a result, in the state of "1" (FIG. 12A) where a large number of holes are accumulated in the body region, there is provided a state equivalent to when the body (substrate) is positively biased. The barrier of the body region as seen from the source is low, so electrons can readily go over the barrier. As a result, the threshold voltage lowers, and current flows in FBC of nMOS and the nMOS turns on. Meanwhile, in the state of "0" (FIG. 12B) where holes are drawn from the body region, there is provided a state equivalent to when the body (substrate) is negatively biased. The barrier of the body region as seen from the source is high, so electrons cannot go over the barrier. Thus, the threshold voltage rises, and current hardly flows in FBC of nMOS and the nMOS does not turn on. In this way, recorded data is read out depending on whether or not current flows in FBC.

Figure 12A:
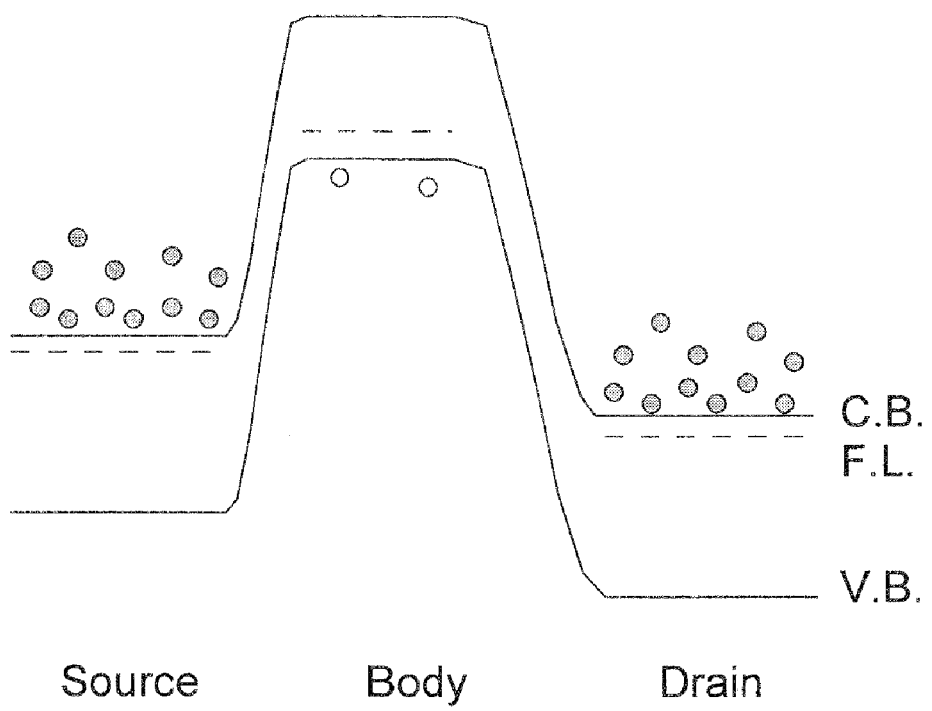
FIG. 12A is a band diagram of a gate insulating film and its vicinities for describing reading out of date in the state where data "1" has been written.
Figure 12B:
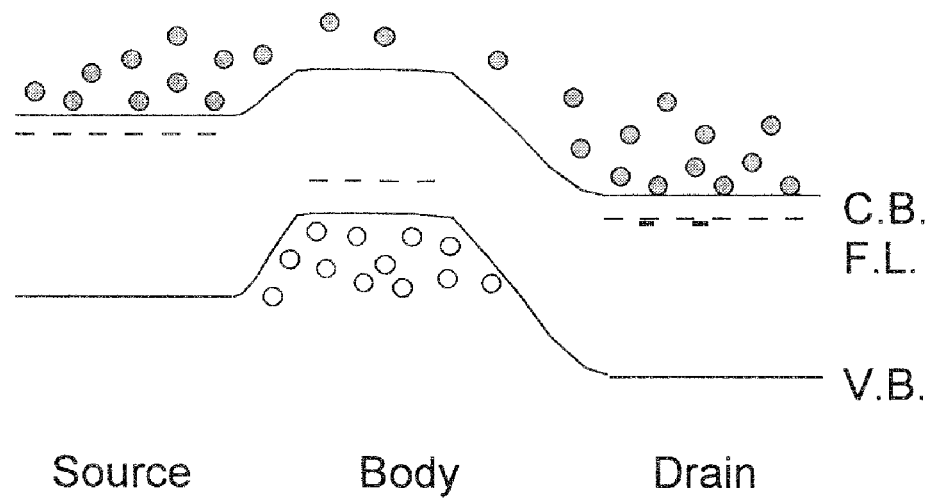
FIG. 12B is a band diagram of a gate insulating film and its vicinities for describing reading out of date in the state where data "0" has been written.

5) Refresh Operation:

The state of electric charges accumulated in the body region shifts to the thermal equilibrium state illustrated in FIG. 12A due to thermal excitation or recoupling through interface state. Thus, it is needed to perform refreshing to hold stored data. In the refresh operation, a potential difference is given between the source and drain, and also a gate voltage is applied to the gate so that the conduction and non-conduction of transistor can be differentiated. This operation may be similar to the read out operation. In this state, the body-source potential difference is changed to a reverse bias state (1.5 V or so), and when current flows, "avalanche breakdown" is created in the body-source connecting section, so that holes included in electron-hole pair are accumulated in the body region. When holes are accumulated in the body region, "avalanche breakdown" occurs and holes are accumulated again in the body region. Thereafter, the source and drain are biased to 0V, and the gate to −2 V, thus creating the standby state, whereby refreshing is performed. The above setting voltages are merely exemplary, and not limited thereto.

[Another Variation]

Figure 13:
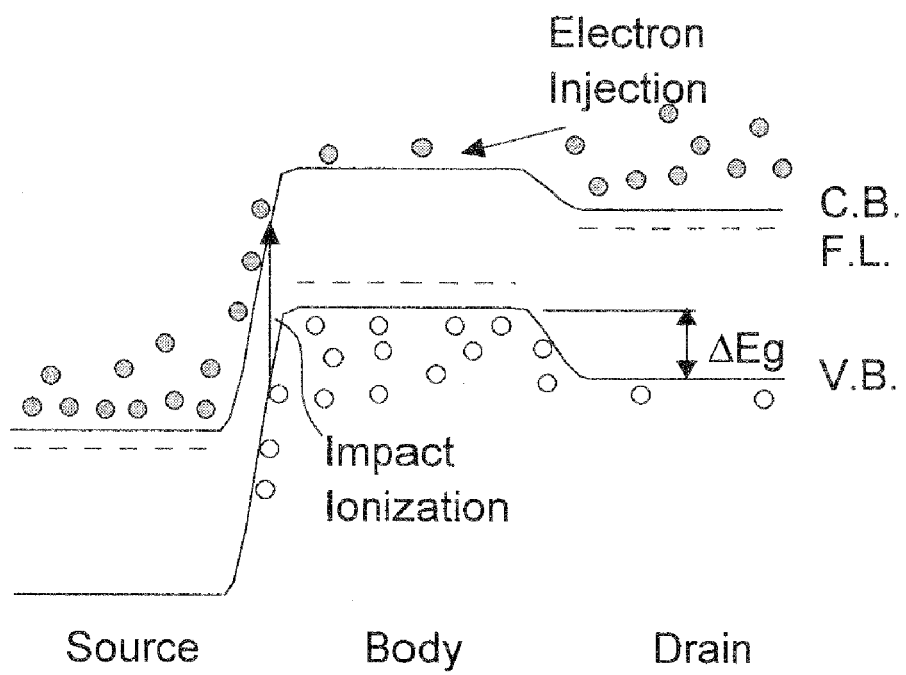
FIG. 13 is a view for describing a variation of band structure of the drain region.
Figure 14:
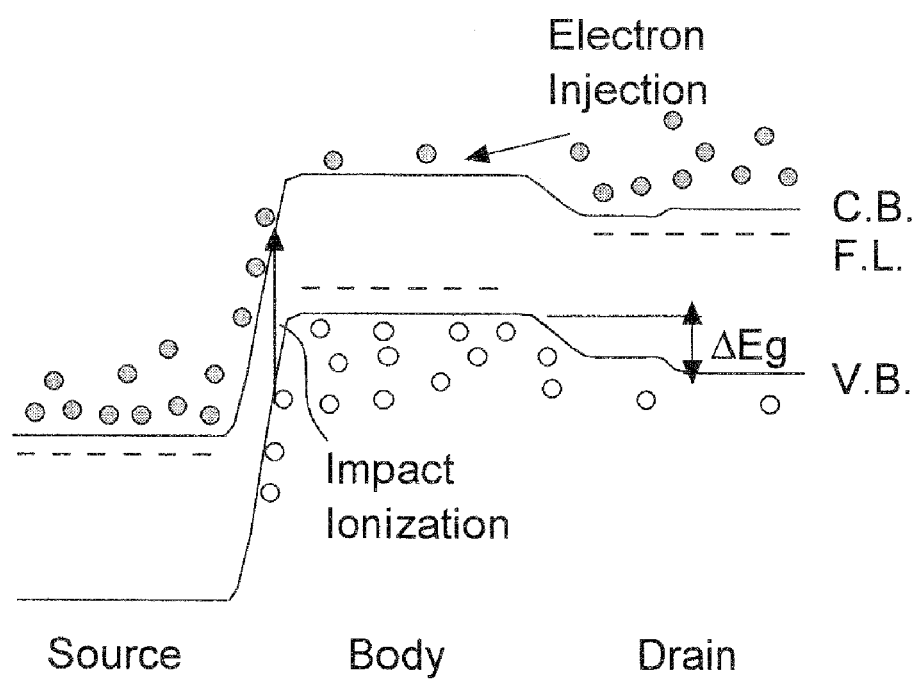
FIG. 14 is a view for describing another variation of band structure of the drain region.
Figure 15:
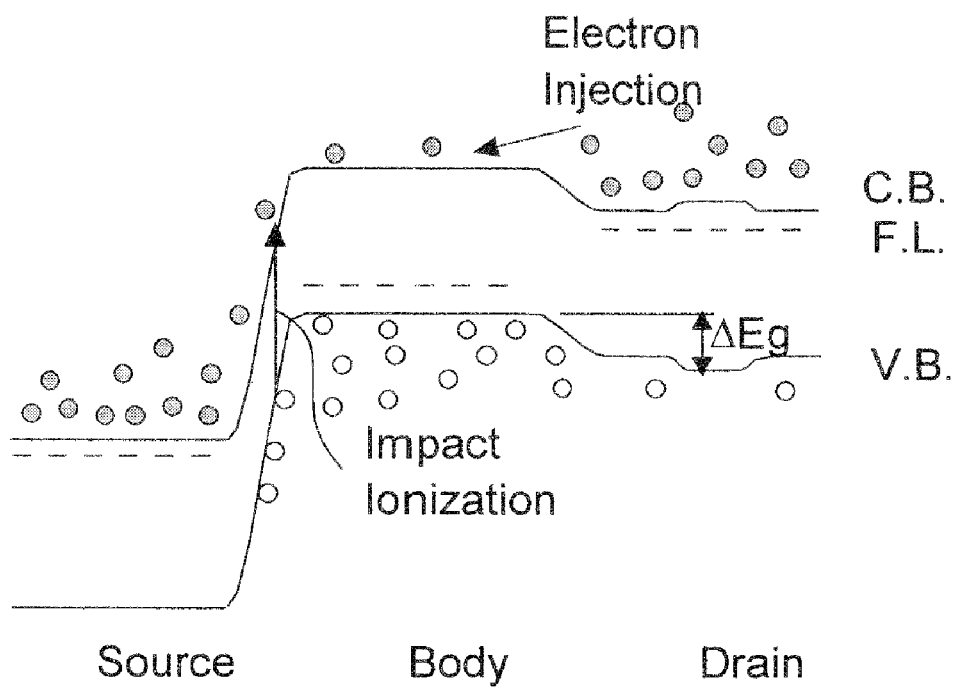
FIG. 15 is a view for describing another variation of band structure of the drain region.
Figure 16:
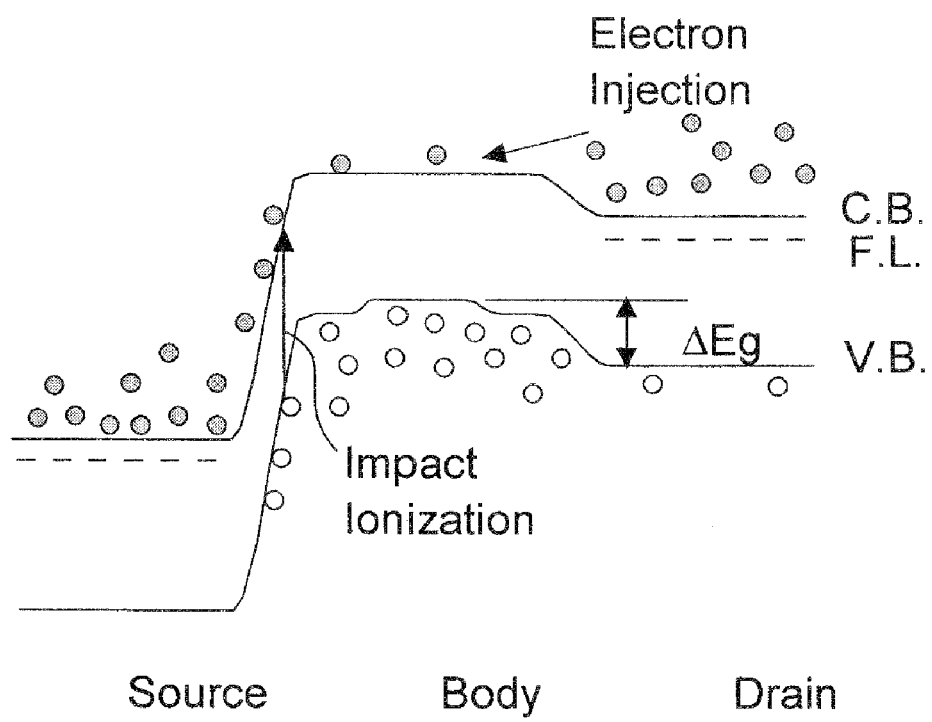
FIG. 16 is a view for describing a variation of band structure of the body region.

FIGS. 13 to 15 illustrate variations of band structure of drain region; and FIG. 16 illustrates a variation of band structure of body region. These figures illustrate the operation of writing data "1" illustrated in FIG. 10C; FIG. 13 illustrates a case where the band gap of drain region is further increased; FIG. 14 illustrates a case where the drain region is constructed using a semiconductor layer having two different band gaps; and FIG. 15 illustrates a case where the drain region has a three-layer structure, and a semiconductor layer having a largest band gap is arranged as the intermediate layer. FIG. 16 illustrates a case where a semiconductor layer having a small band gap is additionally arranged in the body region. In any of the above variations, the band barrier ($\Delta Eg$) as seen from holes is higher than the case of FIG. 10C; thus writing can be done by a lower threshold voltage.

The above described band gap difference ($\Delta Eg$) between Si and SiGe is about 0.1 eV, but in the above variations, $\Delta Eg$ can be enlarged. For example, in order to increase the band gap of drain region, a chemical compound semiconductor (for example, GaPN) having a large band gap may be arranged. In the case of $GaP_{0.978}N_{0.013}$ adjusted to have a lattice constant significantly close to that of Si, the band gap is 2.0 eV or greater, so the barrier to carriers increases.

In forming such hetero junction, it is preferable to select materials having a lattice constant close to each other. When there is a mismatch of lattice constant misfit dislocation or the like may occur, so that the leak current increases. As a combination of materials capable of matching lattice constant and having a different band gap, Si and GaPN, SiGe and GaAsP, Gap and GaAsN and the like may be used.

In order to decrease the band gap in body region, doping of germanium may be increased. Particularly, when the band gap difference is, as illustrated in FIGS. 14 to 16, increased stepwise, leak current caused by lattice constant mismatch or the like can be prevented from flowing; this is preferable compared to when the band gap difference is, as illustrated in FIG. 13, increased at once.

As a combination of semiconductors having a different band gap, chemical compound semiconductors may also be used. For example, in the case of $GaN_xP_{1-x}$, the lattice constant can be brought substantially close to that of Si by adjusting x, and also can have a band gap larger 1 eV or so than Si. Further, GaP, $GaN_yP_{1-y}$, AlP or $AlP_zAs_{1-z}$ may be combined with SiGe. Further, several combinations such as $Ga_\alpha$ $In_{1-\alpha As\ and\ Ga62}$ $In_{1-\beta}P$ may be used.

The present invention has been described with respect to specific embodiments. However, the present invention is not limited to the embodiments, and those skilled in the art will recognize that many changes or modifications to the configuration and details of the present invention are possible within the scope of the invention.

Figure 17A:
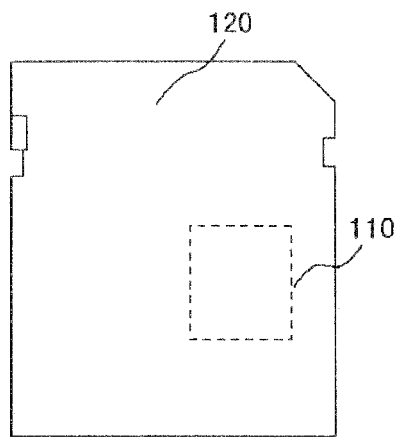
FIGS. 17A to 17C are views for describing applications of FBC type RAM according to the present invention.
Figure 17B:
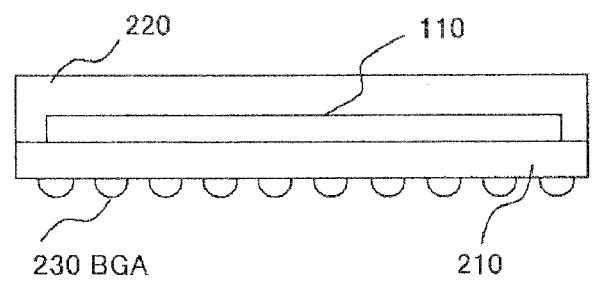
Figure 17C:
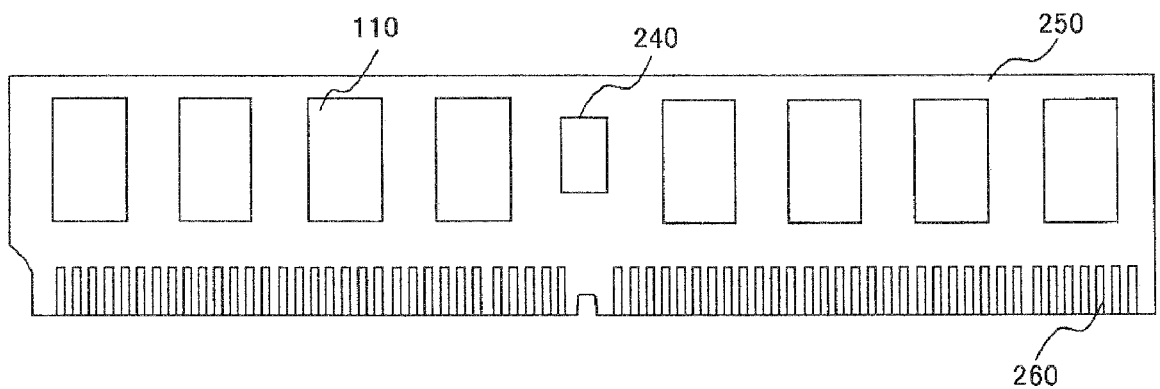

The FBC type RAM according to the present invention can be used in various known memory devices. Examples include: memory card 120 (refer to FIG. 17A) incorporating inventive FBC type RAM chip 110; a memory device (refer to FIG. 17B) having packaged therein memory substrate 210 with inventive FBC type RAM chip 110 by use of ball grid array (BGA) 230 and cover 220; and a memory module (refer to FIG. 17C) having inventive FBC type RAM chip 110 mounted along with interface chip 240 on substrate 250 including terminal 260.

Figure 18:
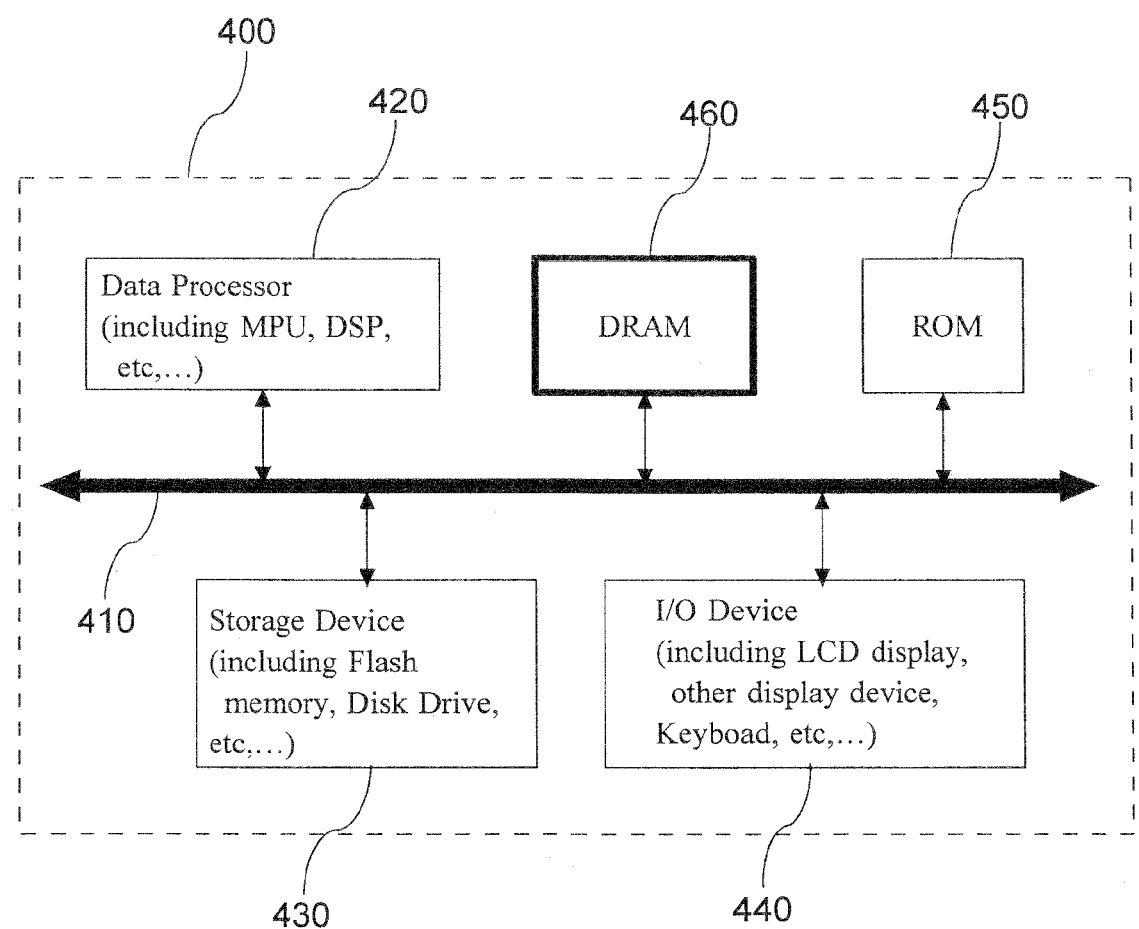
FIG. 18 is a view illustrating an example of data processing system including a DRAM with the inventive FBC type RAM.

FIG. 18 illustrates an example of data processing system 400 including a DRAM (containing the above described memory device) with the inventive FBC type RAM. Data processing system 400 includes, for example, a computer system but is not limited thereto. System 400 includes data processor 420 and DRAM 460 with the inventive FBC type RAM. Data processor 420 includes, for example, a microprocessor (MPU) and digital signal processor (DSP) but is not limited thereto. Referring to FIG. 18, for the sake of simplicity, data processor 420 is connected via system bus 410 to the above DRAM 460 with the inventive FBC type RAM; but instead of using system bus 410, data processor 420 may be connected via a local bus.

For the sake of simplicity, only one line of system bus 410 is illustrated in FIG. 18; but serial or parallel connection may be used via a connector or the like as required. In this system, storage device 430, I/O device 440 and ROM 450 are, as required, connected to system bus 410; but they are not indispensable constituent elements. I/O device 440 may include only one of the input device and output device. For each component, the number of units included is one in FIG. 18 for the sake of simplicity but not limited thereto; at least one of the components may include multiple units. In DRAM 460 with the inventive FBC type RAM, low power consumption can be achieved relative to the related art DRAMs with capacitor, so the above data processing system can be used in a mobile electrical apparatus requiring low power consumption.

The present invention includes the following semiconductor device fabricating method.

(A) A semiconductor device fabricating method including:

(a1) preparing an SOI substrate including a first layer comprising a first semiconductor and a second layer comprising a second semiconductor having a band gap larger than the first semiconductor;

(a2) forming a trench which reaches a buried insulating film of the SOI substrate, and forming an insulating film within the trench to use the insulating film as an element isolation insulating film;

(a3) removing part of the second layer comprising the second semiconductor and forming an opening for exposing the first layer comprising the first semiconductor;

(a4) forming a gate insulating film on a surface of the first layer comprising the first semiconductor and on a surface of the second layer comprising the second semiconductor and forming a gate electrode within the opening; and (a5) implanting, by using the gate electrode as a mask, impurity ion which provides a conduction type different from the first semiconductor, and forming a source and drain region.

(B) A semiconductor device fabricating method including:

(b1) preparing an SOI substrate including a first layer comprising a first semiconductor;

(b2) forming a trench which reaches a buried insulating film of the SOI substrate, and forming an insulating film within the trench to use the insulating film as an element isolation insulating film;

(b3) forming a gate electrode on the first layer comprising the first semiconductor, a gate insulating film being arranged between the first layer and the gate electrode;

(b4) implanting, by using the gate electrode as a mask, impurity ion which provides a conduction type different from the first semiconductor, and forming a source and drain region;

(b5) forming a sidewall spacer on a side surface of the gate electrode;

(b6) removing part of the first layer comprising the first semiconductor between the sidewall spacer and the element isolation insulating film to form a recess;

(b7) forming in the recess, a second semiconductor having a band gap larger than the first semiconductor; and (b8) implanting impurity ion by using, as a mask, the gate electrode having the sidewall spacer formed on the side surface thereof to form a high-concentration impurity region in a region including the second semiconductor.

(C) A semiconductor device fabricating method including:

(c1) preparing an SOI substrate including a second layer comprising a second semiconductor;

(c2) forming a trench which reaches a buried insulating film of the SOI substrate, and forming an insulating film within the trench to use the insulating film as an element isolation insulating film;

(c3) forming a dummy gate on the second layer comprising the second semiconductor and also forming a sidewall spacer on a side surface of the dummy gate;

(c4) forming an interlayer insulating film on the whole surface, and planarizing the interlayer insulating film so that the dummy gate is exposed;

(c5) removing the dummy gate to form an opening;

(c6) supplying via the opening, element different from element constituting the second semiconductor to the second layer comprising the second semiconductor to form a first region comprising a first semiconductor having a band gap smaller than the second semiconductor; and (c7) forming a gate electrode within the opening, a gate insulating film being arranged between the gate electrode and a surface of the opening, (D1) A semiconductor device fabricating method including:

(d-1-1) preparing an SOI substrate including a first layer comprising a first semiconductor;

(d-1-2) forming a trench which reaches a buried insulating film of the SOI substrate, and forming an insulating film within the trench to use the insulating film as an element isolation insulating film;

(d-1-3) forming a gate electrode on the first layer comprising the first semiconductor, a gate insulating film being arranged between the first layer and the gate electrode;

(d-1-4) implanting, by using the gate electrode as a mask, impurity ion which provides a conduction type different from the first semiconductor, and forming a source and drain region;

(d-1-5) forming a sidewall spacer on a side surface of the gate electrode;

(d-1-6) forming an interlayer insulating film on the whole surface;

(d-1-7) forming a contact hole which reaches the source and drain region;

(d-1-8) forming a second layer comprising a second semiconductor having a band gap larger than the first semiconductor in a lower part of the contact hole; and (d-1-9) forming a contact plug in the remaining part of the contact hole.

(D2) A semiconductor device fabricating method including:

(d-2-1) preparing an SOI substrate including a first layer comprising a first semiconductor;

(d-2-2) forming a trench which reaches a buried insulating film of the SOI substrate, and forming an insulating film within the trench to use the insulating film as an element isolation insulating film;

(d-2-3) forming a gate electrode on the first layer comprising the first semiconductor, a gate insulating film being arranged between the first layer and the gate electrode;

(d-2-4) implanting, by using the gate electrode as a mask, impurity ion which provides a conduction type different from the first semiconductor, and forming a source and drain region;

(d-2-5) forming a sidewall spacer on a side surface of the gate electrode; and (d-2-6) forming a second layer comprising a second semiconductor having a band gap larger than the first semiconductor on the whole surface of at least an exposed part of the source and drain region.

(E) The semiconductor device fabricating method according to (A) to (C), and (D1) and (D2), further comprising forming of a recess which reaches at least the first semiconductor and forming of a recess gate within the recess.

(F) The semiconductor device fabricating method according to (E), further including forming of a collar insulating film in an upper end of the recess.

(G) The semiconductor device fabricating method, wherein the first semiconductor is SiGe and the second semiconductor is Si.

(H) The semiconductor device fabricating method, wherein the gate electrode is formed by forming a polymetal structure in which at least a refractory metal layer is arranged on polycrystalline silicon.

Although the present invention has been described above concretely in terms of embodiments of the invention, it is to be understood that the present invention is not limited to those embodiments and that various modifications may be made within the scope not departing from the gist of the invention.

What is claimed is:

1. A semiconductor device comprising:
   a field effect transistor having a floating body structure, and an insulating layer underlying said field effect transistor,
   wherein said field effect transistor comprises:
   a first region comprising a first semiconductor having a given band gap;
   a second region comprising a second semiconductor having a larger band gap than that of the first semiconductor; and
   wherein a channel body region of said field effect transistor is disposed in said first region, said first region in said channel body region extending to said insulating layer.

2. The semiconductor device according to claim 1, wherein the field effect transistor comprises:
   the channel body region;
   a source region;
   a drain region;
   a contact region electrically connected to said source or said drain region; and
   wherein said second region comprising said second semiconductor is disposed between said channel body region and said contact region.

3. The semiconductor device according to claim 2, wherein said channel body region of said field effect transistor is electrically isolated from a substrate by use of an insulating material.

4. The semiconductor device according to claim 1, wherein said first semiconductor comprises SiGe and said second semiconductor comprises Si.

5. The semiconductor device according to claim 1, wherein a first layer comprising said first semiconductor and a second layer comprising said second semiconductor are stacked in an area partitioned by an insulating film, and a gate electrode is located over a region where said first layer comprising said first semiconductor, a part of said second layer being absent comprising said second semiconductor, a gate insulating film being arranged between the gate electrode and said region.

6. The semiconductor device according to claim 1, wherein a first layer comprising said first semiconductor is formed in the area partitioned by the insulating film, and said second semiconductor is buried and formed in a part of the source and drain regions of the field effect transistor, disposed in the first layer comprising said first semiconductor.

7. The semiconductor device according to claim 1, wherein a second layer comprising said second semiconductor is formed in the area partitioned by the isolation insulating film, and a channel body region comprising said first semiconductor having a doping element different from an element constituting said second semiconductor.

8. The semiconductor device according to claim 1, wherein a first layer comprising said first semiconductor is formed in the area partitioned by an element isolation insulating film, and a build-up structure of said second semiconductor is constructed on a source and drain regions of said field effect transistor, disposed in the first layer comprising said first semiconductor.

9. The semiconductor device according to claim 8, wherein the build-up structure of said second semiconductor is formed as a lower part structure of a contact region.

10. The semiconductor device according to claim 1, wherein at least a part of a gate electrode of the field effect transistor is disposed within a recess which reaches said first semiconductor.

11. The semiconductor device according to claim 1, wherein said field effect transistor comprises a gate electrode which comprises polycrystalline silicon and refractory metal element.

12. The semiconductor device according to claim 1, wherein the field effect transistor comprises:
the channel body region;
a gate electrode;
a source region;
a drain region; and
wherein a silicide layer is disposed on the gate electrode, the source region and the drain region.

13. The semiconductor device according to claim 12, wherein said silicide layer is a cobalt silicide layer.

14. A data processing system comprising:
a DATA processor;
an I/O device;
a storage device;
a RAM;
wherein said RAM comprises the device of claim 1.

15. A semiconductor device comprising:
a field effect transistor having a floating body structure, comprising:
a first region comprising a first semiconductor having a given band gap;
a second region comprising a second semiconductor having a larger band gap than that of the first semiconductor;
a channel body region being disposed in said first region;
a source region;
a drain region, and
wherein each of said source and drain region has a high density dopant region and a low density dopant region; and
each said low density dopant region is disposed at least between said channel body region and said high density dopant region of said source or said drain region;
said semiconductor device further comprising an insulating layer underlying said field effect transistor.

16. A semiconductor device comprising:
a field effect transistor having a floating body structure, wherein said field effect transistor comprises:
a first region comprising a first semiconductor having a given band gap;
a second region comprising a second semiconductor having a larger band gap than that of the first semiconductor; and
wherein a channel body region of said field effect transistor is disposed in said first region,
wherein the field effect transistor including the floating body structure is arranged at respective intersections of a plurality of word lines and a plurality of bit lines, and one of the source and drain regions of the field effect transistor is electrically connected to the bit line, and the other of the source and drain regions of the field effect transistor is electrically connected to a source line, and the plurality of bit lines are connected via a selecting switch to a sense amplifier, and the sense amplifier is connected to a line to supply a current having an intermediate value between ON current and OFF current of the field effect transistor.

17. The semiconductor device according to claim 16, wherein the device is disposed in a package.

18. A memory card device, wherein the memory card device having mounted therein a chip comprising the semiconductor device according to claim 16.

19. A memory module device, wherein the memory module device comprises the semiconductor device according to claim 16.

20. The memory module device according to claim 19, further comprising: a memory controller device.

* * * * *

UNITED STATES PATENT AND TRADEMARK OFFICE
CERTIFICATE OF CORRECTION

PATENT NO. : 7,923,766 B2
APPLICATION NO. : 12/483447
DATED : April 12, 2011
INVENTOR(S) : Masayoshi Saito It is certified that error appears in the above-identified patent and that said Letters Patent is hereby corrected as shown below:

In the claims

Column 14, Line 44, Claim 6,
"the area partitioned by the insulating film,"---should read "an area partitioned by an insulating film,"

Column 14, Line 50, Claim 7,
"the area partitioned by the isolation insulating film,"---should read "an area partitioned by an isolation insulating film,"

Column 14, Line 56, Claim 8,
"the area"---should read "an area"

Signed and Sealed this
Sixth Day of October, 2015

Michelle K. Lee
*Director of the United States Patent and Trademark Office*